US 9,881,689 B2

(12) United States Patent
Lee et al.

(10) Patent No.: US 9,881,689 B2
(45) Date of Patent: Jan. 30, 2018

(54) EMISSION DRIVER AND DISPLAY DEVICE INCLUDING THE SAME

(71) Applicant: Samsung Display Co., Ltd., Yongin, Gyeonggi-Do (KR)

(72) Inventors: Hae-Yeon Lee, Bucheon-si (KR); Bo-Yong Chung, Suwon-si (KR); Na-Young Kim, Seongnam-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 405 days.

(21) Appl. No.: 14/597,082

(22) Filed: Jan. 14, 2015

(65) Prior Publication Data

US 2016/0035262 A1 Feb. 4, 2016

(30) Foreign Application Priority Data

Aug. 4, 2014 (KR) .................. 10-2014-0099639

(51) Int. Cl.
*G09G 5/10* (2006.01)
*G11C 19/28* (2006.01)
*G09G 3/3266* (2016.01)

(52) U.S. Cl.
CPC .......... *G11C 19/28* (2013.01); *G09G 3/3266* (2013.01); *G09G 2230/00* (2013.01); *G09G 2300/0861* (2013.01); *G09G 2310/0205* (2013.01); *G09G 2310/0286* (2013.01)

(58) Field of Classification Search
CPC ... G09G 2310/0286; G09G 2320/0233; G09G 2310/0291; G09G 2/20
See application file for complete search history.

(56) References Cited

U.S. PATENT DOCUMENTS

| 2007/0040771 A1 | 2/2007 | Chung et al. |
| 2011/0080393 A1* | 4/2011 | Kim ................. G09G 3/3266 345/208 |
| 2012/0038609 A1 | 2/2012 | Chung |

(Continued)

FOREIGN PATENT DOCUMENTS

| KR | 10-2007-0022550 A | 2/2007 |
| KR | 10-2012-0015113 A | 2/2012 |

(Continued)

*Primary Examiner* — William Boddie
*Assistant Examiner* — Alecia D English
(74) *Attorney, Agent, or Firm* — Knobbe Martens Olson & Bear, LLP

(57) ABSTRACT

An emission driver and a display device having the same are disclosed. In one aspect, the emission driver includes a plurality of stages each configured to output an emission control signal, wherein each of the stages includes first and second driving blocks and a buffer block. The buffer block is configured to selectively output an emission control signal so as to operate in a sequential emission mode or in a simultaneous emission mode, the stages being configured to sequentially output a plurality of the emission control signals in the sequential emission mode and substantially simultaneously output the emission control signals in the simultaneous emission mode. The buffer block is further configured to determine a duration in which the emission control signal has a first voltage level based on an interval between time points when first and second intermediate signals have low voltage levels.

20 Claims, 11 Drawing Sheets

(56) References Cited

U.S. PATENT DOCUMENTS

| | | |
|---|---|---|
| 2012/0081409 A1 | 4/2012 | Chung |
| 2012/0105423 A1 | 5/2012 | Chung |
| 2012/0188290 A1* | 7/2012 | Park .................... G09G 3/3266 |
| | | 345/690 |
| 2013/0050161 A1 | 2/2013 | Park et al. |

FOREIGN PATENT DOCUMENTS

| | | |
|---|---|---|
| KR | 10-2012-0033672 A | 4/2012 |
| KR | 10-2012-0044784 A | 5/2012 |
| KR | 10-2013-0023488 A | 3/2013 |

\* cited by examiner

US 9,881,689 B2

EMISSION DRIVER AND DISPLAY DEVICE INCLUDING THE SAME

CROSS-REFERENCE TO RELATED APPLICATIONS

This application claims priority from and the benefit of Korean Patent Applications No. 10-2014-0099639, filed on Aug. 4, 2014 in the Korean Intellectual Property Office (KIPO), the disclosure of which is hereby incorporated by reference herein in its entirety.

BACKGROUND

Field

The described technology generally relates to emission drivers and display devices including the same.

Description of the Related Technology

Display devices can be driven by an analog driving method for enhanced image quality. A typical flat panel display includes a scan driver, a data driver, and an emission driver for driving the display panel. The emission driver controls light emission of the display panel.

Recently, research and development relating to various display modes such as two-dimensional (2D), three-dimensional (3D) stereoscopic, etc. has increased.

SUMMARY OF CERTAIN INVENTIVE ASPECTS

One inventive aspect is an emission driver applied to a sequential emission mode and a simultaneous emission mode.

Another aspect is a display device including the emission driver.

Another aspect is a display device that includes a plurality of stages configured to output respective emission control signals. Each of the stages can include a first driving block configured to receive a first input signal, a first clock signal, a second clock signal, and a first driving signal, and to output a first intermediate signal in response to the first input signal and the first driving signal, a second driving block configured to receive a second input signal, the first clock signal, the second clock signal, and a second driving signal, and to output a second intermediate signal in response to the second input signal and the second driving signal, and a buffer block configured to receive the first intermediate signal and the second intermediate signal, and to output an emission control signal in response to the first intermediate signal and the second intermediate signal. The buffer block can selectively output the emission control signal to operate in a sequential emission mode or in a simultaneous emission mode, the emission control signal being sequentially output from the each of the stages in the sequential emission mode, the emission control signal being simultaneously output from the each of the stages in the simultaneous emission mode. The buffer block can determine a duration in which the emission control signal has a first voltage level based on an interval between a time point at which the first intermediate signal has a low voltage level and a time point at which the second intermediate signal has the low voltage level.

In example embodiments, the buffer block outputs the emission control signal having the first voltage level when the first intermediate signal has the low voltage level, and outputs the emission control signal having a second voltage level lower than the first voltage level when the second intermediate signal has the low voltage level.

In example embodiments, a rising edge of the emission control signal is synchronized with a falling edge of the first intermediate signal, and a falling edge of the emission control signal can be s synchronized with a falling edge of the second intermediate signal.

In example embodiments, the first driving signal and the second driving signal is maintained to have a high voltage level when the emission driver operates in the sequential emission mode. The first input signal, the second input signal, the first clock signal, and the second clock signal can be maintained to have the high voltage level when the emission driver operates in the simultaneous emission mode.

In example embodiments, the first driving block includes a first input unit configured to transmit the first clock signal to a second node in response to a first node signal applied to a first node, a second input unit configured to transmit the first input signal to the first node in response to the first clock signal, a pull-up unit configured to pull up the first intermediate signal in response to a second node signal applied to the second node, a pull-down unit configured to pull down the first intermediate signal in response to the first node signal, a simultaneous driving control unit configured to inactivate the pull-down unit in response to the first driving signal, a holding unit configured to maintain the second node signal in response to the first clock signal, and a stabilizing unit configured to stabilize the first intermediate signal in response to the second node signal and the second clock signal.

In example embodiments, the first input unit includes a first transistor having a gate electrode connected to the first node, a source electrode to which the first clock signal is applied, and a drain electrode connected to the second node. The second input unit can include a second transistor having a gate electrode to which the first clock signal is applied, a source electrode to which the first input signal is applied, and a drain electrode connected to the first node. The pull-up unit can include a third transistor having a gate electrode connected to the second node, a source electrode to which the first driving signal is applied, and a drain electrode connected to an output terminal for outputting the first intermediate signal. The pull-down unit can include a fourth transistor having a gate electrode connected to the first node, a source electrode to which the second clock signal is applied, and a drain electrode connected to the output terminal. The driving control unit can include a fifth transistor having a gate electrode to which the first driving signal is applied, a source electrode to which a high DC voltage is applied, and a drain electrode connected to the first node. The holding unit can include a sixth transistor having a gate electrode and a source electrode to which the first clock is applied, and a drain electrode connected to the second node.

In example embodiments, the stabilizing unit includes a seventh transistor and an eighth transistor that are connected in series. The seventh transistor can include a gate electrode connected to the second node, a source electrode to which a pull-up voltage of the first intermediate signal is applied, and a drain electrode connected to a source electrode of the eighth transistor. The eighth transistor can include a gate electrode to which the second clock signal is applied, a source electrode connected to the drain electrode of the seventh transistor, and a drain electrode connected to the first node.

In example embodiments, the second driving block includes a first input unit configured to transmit the second clock signal to a second node in response to a first node signal applied to a first node, a second input unit configured to transmit the second input signal to the first node in response to the second clock signal, a pull-up unit configured to pull up the second intermediate signal in response to a second node signal applied to the second node, a pull-down unit configured to pull down the second intermediate signal in response to the first node signal, a driving control unit configured to inactivate the pull-down unit in response to the second driving signal, a holding unit configured to maintain the second node signal in response to the second clock signal, and a stabilizing unit configured to stabilize the second intermediate signal in response to the second node signal and the first clock signal.

In example embodiments, the first input unit includes a first transistor having a gate electrode connected to the first node, a source electrode to which the second clock signal is applied, and a drain electrode connected to the second node. The second input unit can include a second transistor having a gate electrode to which the second clock signal is applied, a source electrode to which the second input signal is applied, and a drain electrode connected to the first node. The pull-up unit can include a third transistor having a gate electrode connected to the second node, a source electrode to which the second driving signal is applied, and a drain electrode connected to an output terminal for outputting the second intermediate signal. The pull-down unit can include a fourth transistor having a gate electrode connected to the first node, a source electrode to which the first clock signal is applied, and a drain electrode connected to the output terminal. The driving control unit can include a fifth transistor having a gate electrode to which the second driving signal, a source electrode to which a high DC voltage is applied, and a drain electrode connected to the first node. The holding unit can include a sixth transistor having a gate electrode and a source electrode to which the second clock is applied, and a drain electrode connected to the second node.

In example embodiments, the buffer block includes a first input unit configured to transmit a high DC voltage to a first node in response to the first intermediate signal and to transmit a low DC voltage to a second node in response to the first intermediate signal, a second input unit configured to transmit the low DC voltage to the first node in response to the second intermediate signal, a first holding unit configured to maintain a second node signal applied to the second node in response to a first node signal applied to the first node, a pull-up unit configured to pull up the emission control signal in response to the second node signal, and a pull-down unit configured to pull down the emission control signal in response to the first node signal.

In example embodiments, the first input unit includes a first transistor having a gate electrode to which the first intermediate signal is applied, a source electrode to which the high DC voltage is applied, and a drain electrode connected to the first node, and a second transistor having a gate electrode to which the first intermediate signal is applied, a source electrode to which the low DC voltage is applied, and a drain electrode connected to the second node.

In example embodiments, the second input unit includes a third transistor having a gate electrode to which the second intermediate signal is applied, a source electrode to which the low DC voltage is applied, and a drain electrode connected to the first node. The first holding unit can include a fourth transistor having a gate electrode connected to the first node, a source electrode to which the high DC voltage is applied, and a drain electrode connected to the second node. The pull-up unit can include a fifth transistor having a gate electrode connected to the second node, a source electrode to which the high DC voltage is applied, and a drain electrode connected to an emission control signal output terminal for outputting the emission control signal. The pull-down unit can include a sixth transistor having a gate electrode connected to the first node, a source electrode to which the low DC voltage is applied, and a drain electrode connected to the emission control signal output terminal.

In example embodiments, the pull-down unit includes a first pull-down transistor and a second pull-down transistor that are connected in series. The first pull-down transistor can include a gate electrode connected to the first node, a source electrode connected to a drain electrode of the second pull-down transistor, and a drain electrode connected to an emission control signal output terminal. The second pull-down transistor can include a gate electrode to which a third clock signal is applied, a source electrode connected to the gate electrode, and the drain electrode connected to the source electrode of the first pull-down transistor.

In example embodiments, the second input unit includes a third transistor having a gate electrode to which the second intermediate signal is applied, a source electrode to which the low DC voltage is applied, and a drain electrode connected to the first node. The first holding unit can include a fourth transistor having a gate electrode connected to the first node, a source electrode to which the high DC voltage is applied, and a drain electrode connected to the second node. The pull-up unit can include a fifth transistor having a gate electrode connected to the second node, a source electrode to which the high DC voltage is applied, and a drain electrode connected to the emission control signal output terminal.

In example embodiments, the buffer block further includes a second holding unit configured to maintain the first node signal in response to the second node signal. The second holding unit can include a holding transistor having a gate electrode connected to the second node, a source electrode to which the high DC voltage is applied, and a drain electrode connected to the first node.

Another aspect is a method of manufacturing a display device that includes a display panel including a plurality of pixels, a data driver configured to output a plurality of data signals to the display panel, a scan driver including a plurality of scan stages, each of the scan stages outputting a scan signal to the display panel, and an emission driver including a plurality of stages, each of the stages outputting an emission control signal to the display panel. Each of the stages of the emission driver can include a first driving block configured to receive a first input signal, a first clock signal, a second clock signal, and a first driving signal, and to output a first intermediate signal in response to the first input signal and the first driving signal, a second driving block configured to receive a second input signal, the first clock signal, the second clock signal, and a second driving signal, and to output a second intermediate signal in response to the second input signal and the second driving signal, and a buffer block configured to receive the first intermediate signal and the second intermediate signal, and to output the emission control signal in response to the first intermediate signal and the second intermediate signal. The buffer block can selectively output the emission control signal to operate in a sequential emission mode or in a simultaneous emission mode, the emission control signal being sequentially output from the each of the stages in the sequential emission mode, and the emission control signal being simultaneously output from the each of the stages in the simultaneous emission mode. The buffer block can determine a duration in which the emission control signal has a first voltage level based on an interval between a time point at which the first intermediate signal has the low voltage level and a time point at which the second intermediate signal has the low voltage level.

In example embodiments, the buffer block outputs the emission control signal having the first voltage level when the first intermediate signal has the low voltage level, and output the emission control signal having a second voltage level lower than the first voltage level when the second intermediate signal has the low voltage level.

In example embodiments, the first driving signal and the second driving signal are maintained to have a high voltage level when the emission driver operates in the sequential emission mode. The first input signal, the second input signal, the first clock signal, and the second clock signal can be maintained to have the high voltage level when the emission driver operates in the simultaneous emission mode.

In example embodiments, the first driving block includes a first input unit configured to transmit the first clock signal to a second node in response to a first node signal applied to a first node, a second input unit configured to transmit the first input signal to the first node in response to the first clock signal, a pull-up unit configured to pull up the first intermediate signal in response to a second node signal applied to the second node, a pull-down unit configured to pull down the first intermediate signal in response to the first node signal, a driving control unit configured to inactivate the pull-down unit in response to the first driving signal, a holding unit configured to maintain the second node signal in response to the first clock signal, and a stabilizing unit configured to stabilize the first intermediate signal in response to the second node signal and the second clock signal.

In example embodiments, the buffer block includes a first input unit configured to transmit a high DC voltage to a first node in response to the first intermediate signal and to transmit a low DC voltage to a second node in response to the first intermediate signal, a second input unit configured to transmit the low DC voltage to the first node in response to the second intermediate signal, a holding unit configured to maintain a second node signal applied to the second node in response to a first node signal applied to the first node, a pull-up unit configured to pull up the emission control signal in response to the second node signal, and a pull-down unit configured to pull down the emission control signal in response to the first node signal.

Therefore, the emission driver and the display device having the same according to example embodiments output the emission signal selectively and variously to operate in the respective emission modes (i.e., the sequential emission mode and the simultaneous emission mode) based on timing of the clock signals and the driving signals. Thus, driving the display device in various display modes (e.g., 3-dimensional (3D) stereoscopic image display mode, etc.) can be simplified by adjusting timing of the clock signals and the driving signals, and image quality can be improved. Further, a falling speed of the emission control signal (i.e., a pull down speed or response speed) can be improved by an operation and a circuit configuration of the buffer block.

In addition, a duty ratio can be freely controlled by adjusting the timing of the driving signals (in the simultaneous emission mode) or the timing of the input signals (in the sequential emission mode).

Another aspect is an emission driver for a display device, the emission driver comprising a plurality of stages each configured to output an emission control signal. Each of the stages includes a first driving block configured to i) receive a first input signal, first and second clock signals, and a first driving signal, and ii) output a first intermediate signal based at least in part on the first input signal and the first driving signal. Each stage also includes a second driving block configured to i) receive a second input signal, the first and second clock signals, and a second driving signal, and ii) output a second intermediate signal based at least in part on the second input signal and the second driving signal. Each stage further includes a buffer block configured to i) receive the first and second intermediate signals, and ii) output an emission control signal based at least in part on the first and second intermediate signals, wherein the buffer block is further configured to selectively output the emission control signal so as to operate in a sequential emission mode or in a simultaneous emission mode. The stages are configured to i) sequentially output a plurality of the emission control signals in the sequential emission mode and ii) substantially simultaneously output the emission control signals in the simultaneous emission mode. The buffer block is further configured to determine a duration in which the emission control signal has a first voltage level based at least in part on an interval between a time point when the first intermediate signal has a low voltage level and a time point when the second intermediate signal has the low voltage level.

In the above emission driver, the buffer block is further configured to output i) the emission control signal having the first voltage level when the first intermediate signal has the low voltage level and ii) the emission control signal having a second voltage level lower than the first voltage level when the second intermediate signal has the low voltage level.

In the above emission driver, a rising edge of the emission control signal is substantially synchronized with a falling edge of the first intermediate signal, wherein a falling edge of the emission control signal is substantially synchronized with a falling edge of the second intermediate signal.

In the above emission driver, the first and second driving signals are configured to be maintained to have a high voltage level when the emission driver operates in the sequential emission mode, wherein the first and second input signals and the first and second clock signals are configured to be maintained to have the high voltage level when the emission driver operates in the simultaneous emission mode.

In the above emission driver, the first driving block includes a first input unit configured to transmit the first clock signal to a second node based at least in part on a first node signal configured to be applied to a first node, a second input unit configured to transmit the first input signal to the first node based at least in part on the first clock signal, and a pull-up unit configured to pull up the first intermediate signal based at least in part on a second node signal configured to be applied to the second node. In the above emission driver, the first driving block further includes a pull-down unit configured to pull down the first intermediate signal based at least in part on the first node signal, a driving controller configured to inactivate the pull-down unit based at least in part on the first driving signal, a holding unit configured to maintain the second node signal based at least in part on the first clock signal, and a stabilizing unit configured to stabilize the first intermediate signal based at least in part on the second node signal and the second clock signal.

In the above emission driver, the first input unit includes a first transistor having a gate electrode electrically connected to the first node, a source electrode to which the first clock signal is configured to be applied, and a drain electrode electrically connected to the second node. In the above emission driver, the second input unit includes a second transistor having a gate electrode to which the first clock signal is configured to be applied, a source electrode to which the first input signal is configured to be applied, and a drain electrode electrically connected to the first node. In the above emission driver, the pull-up unit includes a third transistor having a gate electrode electrically connected to the second node, a source electrode to which the first driving signal is configured to be applied, and a drain electrode electrically connected to an output terminal configured to output the first intermediate signal. In the above emission driver, the pull-down unit includes a fourth transistor having a gate electrode electrically connected to the first node, a source electrode to which the second clock signal is configured to be applied, and a drain electrode electrically connected to the output terminal. In the above emission driver, the driving controller includes a fifth transistor having a gate electrode to which the first driving signal is configured to be applied, a source electrode to which a high DC voltage is configured to be applied, and a drain electrode electrically connected to the first node. In the above emission driver, the holding unit includes a sixth transistor having a gate electrode and a source electrode to which the first clock is configured to be applied, and a drain electrode electrically connected to the second node.

In the above emission driver, the stabilizing unit includes seventh and eighth transistors electrically connected in series. In the above emission driver, the seventh transistor includes a gate electrode electrically connected to the second node, a source electrode to which a pull-up voltage of the first intermediate signal is configured to be applied, and a drain electrode electrically connected to a source electrode of the eighth transistor. In the above emission driver, the eighth transistor includes a gate electrode to which the second clock signal is configured to be applied, a source electrode electrically connected to the drain electrode of the seventh transistor, and a drain electrode electrically connected to the first node.

In the above emission driver, the second driving block includes a first input unit configured to transmit the second clock signal to a second node based at least in part on a first node signal configured to be applied to a first node, a second input unit configured to transmit the second input signal to the first node based at least in part on the second clock signal, and a pull-up unit configured to pull up the second intermediate signal based at least in part on a second node signal configured to be applied to the second node. In the above emission driver, the second driving block also includes a pull-down unit configured to pull down the second intermediate signal based at least in part on the first node signal, a driving controller configured to inactivate the pull-down unit based at least in part on the second driving signal. In the above emission driver, the second driving block further includes a holding unit configured to maintain the second node signal based at least in part on the second clock signal, and a stabilizing unit configured to stabilize the second intermediate signal based at least in part on the second node signal and the first clock signal.

In the above emission driver, the first input unit includes a first transistor having a gate electrode electrically connected to the first node, a source electrode to which the second clock signal is configured to be applied, and a drain electrode electrically connected to the second node. In the above emission driver, the second input unit includes a second transistor having a gate electrode to which the second clock signal is configured to be applied, a source electrode to which the second input signal is configured to be applied, and a drain electrode electrically connected to the first node. In the above emission driver, the pull-up unit includes a third transistor having a gate electrode electrically connected to the second node, a source electrode to which the second driving signal is configured to be applied, and a drain electrode electrically connected to an output terminal configured to output the second intermediate signal. In the above emission driver, the pull-down unit includes a fourth transistor having a gate electrode electrically connected to the first node, a source electrode to which the first clock signal is configured to be applied, and a drain electrode electrically connected to the output terminal. In the above emission driver, the driving controller includes a fifth transistor having a gate electrode to which the second driving signal is configured to be applied, a source electrode to which a high DC voltage is configured to be applied, and a drain electrode electrically connected to the first node. In the above emission driver, the holding unit includes a sixth transistor having a gate electrode and a source electrode to which the second clock is configured to be applied, and a drain electrode electrically connected to the second node.

In the above emission driver, the buffer block includes a first input unit configured to transmit i) a high DC voltage to a first node based at least in part on the first intermediate signal and ii) a low DC voltage to a second node based at least in part on the first intermediate signal. In the above emission driver, the buffer block also includes a second input unit configured to transmit the low DC voltage to the first node based at least in part on the second intermediate signal and a first holding unit configured to maintain a second node signal configured to be applied to the second node based at least in part on a first node signal configured to be applied to the first node. In the above emission driver, the buffer block further includes a pull-up unit configured to pull up the emission control signal based at least in part on the second node signal and a pull-down unit configured to pull down the emission control signal based at least in part on the first node signal.

In the above emission driver, the first input unit includes a first transistor having a gate electrode to which the first intermediate signal is configured to be applied, a source electrode to which the high DC voltage is configured to be applied, and a drain electrode electrically connected to the first node. In the above emission driver, the first input unit also includes a second transistor having a gate electrode to which the first intermediate signal is configured to be applied, a source electrode to which the low DC voltage is configured to be applied, and a drain electrode electrically connected to the second node.

In the above emission driver, the second input unit includes a third transistor having a gate electrode to which the second intermediate signal is configured to be applied, a source electrode to which the low DC voltage is configured to be applied, and a drain electrode electrically connected to the first node. In the above emission driver, the first holding unit includes a fourth transistor having a gate electrode electrically connected to the first node, a source electrode to which the high DC voltage is configured to be applied, and a drain electrode electrically connected to the second node. In the above emission driver, the pull-up unit includes a fifth transistor having a gate electrode electrically connected to the second node, a source electrode to which the high DC voltage is configured to be applied, and a drain electrode electrically connected to an emission control signal output terminal configured to output the emission control signal. In the above emission driver, the pull-down unit includes a sixth transistor having a gate electrode electrically connected to the first node, a source electrode to which the low DC voltage is configured to be applied, and a drain electrode electrically connected to the emission control signal output terminal.

In the above emission driver, the pull-down unit includes first and second pull-down transistors electrically connected in series. In the above emission driver, the first pull-down transistor includes a gate electrode electrically connected to the first node, a source electrode electrically connected to a drain electrode of the second pull-down transistor, and a drain electrode electrically connected to an emission control signal output terminal. In the above emission driver, the second pull-down transistor includes a gate electrode to which a third clock signal is configured to be applied, a source electrode electrically connected to the gate electrode, and the drain electrode electrically connected to the source electrode of the first pull-down transistor.

In the above emission driver, the second input unit includes a third transistor having a gate electrode to which the second intermediate signal is configured to be applied, a source electrode to which the low DC voltage is configured to be applied, and a drain electrode electrically connected to the first node. In the above emission driver, the first holding unit includes a fourth transistor having a gate electrode connected to the first node, a source electrode to which the high DC voltage is applied, and a drain electrode connected to the second node. In the above emission driver, the pull-up unit includes a fifth transistor having a gate electrode electrically connected to the second node, a source electrode to which the high DC voltage is configured to be applied, and a drain electrode electrically connected to the emission control signal output terminal.

In the above emission driver, the buffer block further includes a second holding unit configured to maintain the first node signal based at least in part on the second node signal, wherein the second holding unit includes a holding transistor having a gate electrode electrically connected to the second node, a source electrode to which the high DC voltage is configured to be applied, and a drain electrode electrically connected to the first node.

Another aspect is a display device comprising a display panel including a plurality of pixels, a data driver configured to output a plurality of data signals to the display panel, a scan driver including a plurality of scan stages each configured to output a scan signal to the display panel, and an emission driver including a plurality of stages each configured to output an emission control signal to the display panel. Each of the stages of the emission driver includes a first driving block configured i) to receive a first input signal, first and second clock signals, and a first driving signal, and ii) output a first intermediate signal based at least in part on the first input signal and the first driving signal. Each stage also includes a second driving block configured to i) receive a second input signal, the first and second clock signals, and a second driving signal, and ii) output a second intermediate signal based at least in part on the second input signal and the second driving signal. Each stage further includes a buffer block configured to i) receive the first and second intermediate signals, and ii) output the emission control signal based at least in part on the first and second intermediate signals. The buffer block is further configured to selectively output the emission control signal so as to operate in a sequential emission mode or in a simultaneous emission mode, wherein the stages of the emission driver are configured to i) sequentially output a plurality of the emission control signals in the sequential emission mode and ii) substantially simultaneously output the emission control signals in the simultaneous emission mode. The buffer block is further configured to determine a duration in which the emission control signal has a first voltage level based at least in part on an interval between a time point when the first intermediate signal has the low voltage level and a time point when the second intermediate signal has the low voltage level.

In the above display device, the buffer block is further configured to output i) the emission control signal having the first voltage level when the first intermediate signal has the low voltage level and ii) the emission control signal having a second voltage level lower than the first voltage level when the second intermediate signal has the low voltage level.

In the above display device, the first and second driving signals are configured to be maintained to have a high voltage level when the emission driver operates in the sequential emission mode, wherein the first and second input signals and the first and second clock signals are configured to be maintained to have the high voltage level when the emission driver operates in the simultaneous emission mode.

In the above display device, the first driving block includes a first input unit configured to transmit the first clock signal to a second node based at least in part on a first node signal configured to be applied to a first node, a second input unit configured to transmit the first input signal to the first node based at least in part on the first clock signal, and a pull-up unit configured to pull up the first intermediate signal based at least in part on a second node signal configured to be applied to the second node. In the above display device, the first driving block also includes a pull-down unit configured to pull down the first intermediate signal based at least in part on the first node signal and a driving controller configured to inactivate the pull-down unit based at least in part on the first driving signal. In the above display device, the first driving block further includes a holding unit configured to maintain the second node signal based at least in part on the first clock signal and a stabilizing unit configured to stabilize the first intermediate signal based at least in part on the second node signal and the second clock signal.

In the above display device, the buffer block includes a first input unit configured to transmit i) a high DC voltage to a first node based at least in part on the first intermediate signal and ii) a low DC voltage to a second node based at least in part on the first intermediate signal. In the above display device, the buffer block also includes a second input unit configured to transmit the low DC voltage to the first node based at least in part on the second intermediate signal. In the above display device, the buffer block further includes a holding unit configured to maintain a second node signal configured to be applied to the second node based at least in part on a first node signal configured to be applied to the first node, a pull-up unit configured to pull up the emission control signal based at least in part on the second node signal, and a pull-down unit configured to pull down the emission control signal based at least in part on the first node signal.

DETAILED DESCRIPTION OF CERTAIN INVENTIVE EMBODIMENTS

Typical emission drivers cannot generate a proper emission control signal corresponding to a change of a display mode (e.g., a sequential emission mode, simultaneous emission mode, etc.). In addition, it is difficult to control a duty rate of the emission control signal due to driver circuit configuration.

Exemplary embodiments will be described more fully hereinafter with reference to the accompanying drawings, in which various embodiments are shown. In this disclosure, the term "substantially" includes the meanings of completely, almost completely or to any significant degree under some applications and in accordance with those skilled in the art. Moreover, "formed on" can also mean "formed over." The term "connected" can include an electrical connection.

Figure 1:
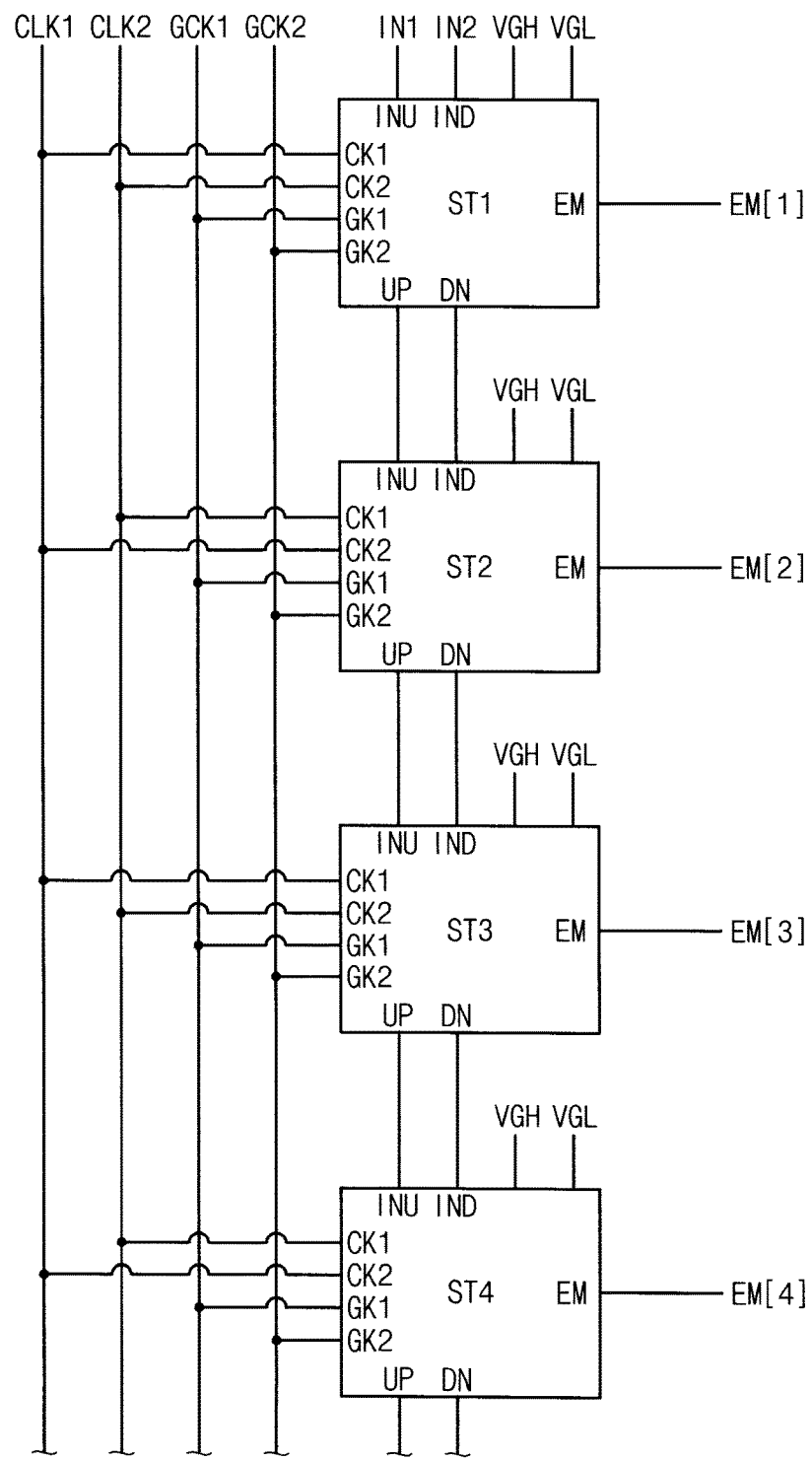
FIG. 1 is block diagram of an emission driver according to example embodiments.

FIG. 1 is block diagram of an emission driver according to example embodiments.

Referring to FIG. 1, the emission driver 100 includes a plurality of stages ST1, ST2, ST3, ST4, . . . connected to one another. The stages ST1, ST2, ST3, ST4, . . . can output emission control signals.

Each of the stages ST1, ST2, ST3, ST4, . . . can include a first clock terminal CK1, a second clock terminal CK2, a first driving signal input terminal GK1, a second driving signal input terminal GK2, a first input terminal INU, a second input terminal IND, and an emission control signal output terminal EM. Each of the stages ST1, ST2, ST3, ST4, . . . can further include a high DC voltage input terminal VGH and a low DC voltage input terminal VGL.

In the present exemplary embodiment, first and second clock signals CLK1 and CLK2 having different timings are respectively applied to the first and second clock terminals CK1 and CK2. For example, the second clock signal CLK2 is a signal inverted from the first clock signal CLK1.

In adjacent stages, the first clock signal CLK1 and the second clock signal CLK2 can be applied to the clock terminals in opposite sequences. For example, the first clock signal CLK1 is applied to the first clock terminal CK1 of odd-numbered stages ST1, ST3, . . . and the second clock signal CLK2 is applied to the second clock terminal CK2 of the odd-numbered stages ST1, ST3, . . . . In contrast, the first clock signal CLK1 can be applied to the second clock terminal CK2 of even-numbered stages ST2, ST4, . . . and the second clock signal CLK2 can be applied to the first clock terminal CK1 of the even-numbered stages ST1, ST3, . . . .

The first and second driving signals GCK1 and GCK2 can be respectively applied to the first and second driving signal input terminals GK1 and GK2. The first and second driving signals GCK1 and GCK2 can have a first voltage level (i.e., a low voltage level) within a certain duration when the emission driver 100 is driven by a simultaneous emission mode. All stages ST1, ST2, ST3, ST4, . . . can output the same emission control signals EM[1], EM[2], EM[3], EM[4], . . . substantially simultaneously. In contrast, the first and second driving signals GCK1 and GCK2 can have a second voltage level (i.e., a high voltage level) when the emission driver 100 is driven by a sequential emission mode. The emission driver 100 can sequentially output the emission control signals EM[1], EM[2], EM[3], EM[4], . . . . The first and second driving signals GCK1 and GCK2 can be applied to the first and second driving signal input terminals GK1 and GK2 of the stages ST1, ST2, ST3, ST4, . . . .

A first start signal IN1 or a first intermediate signal of a previous stage can be applied to the first input terminal INU. A second start signal IN2 or a second intermediate signal of the previous stage can be applied to the second input terminal IND.

A first intermediate signal output terminal UP and a second intermediate signal output terminal DN can respectively output the first intermediate signal and the second intermediate signal. For example, in the sequential emission mode, each first intermediate signal pulls up the emission control signals EM[1], EM[2], EM[3], EM[4], . . . and each second intermediate signal pulls down the emission control signals EM[1], EM[2], EM[3], EM[4], . . . .

The emission control signal output terminals EM can output the emission control signals EM[1], EM[2], EM[3], EM[4], . . . to emission control lines. For example, the emission control signals EM[1], EM[2], EM[3], EM[4], . . . are sequentially outputted based at least in part on the first and second clock signals CLK1 and CLK2. In contrast, the emission control signals EM[1], EM[2], EM[3], EM[4], . . . can be substantially simultaneously outputted based at least in part on the first level of the first and second driving signals GCK1 and GCK2.

Figure 2:
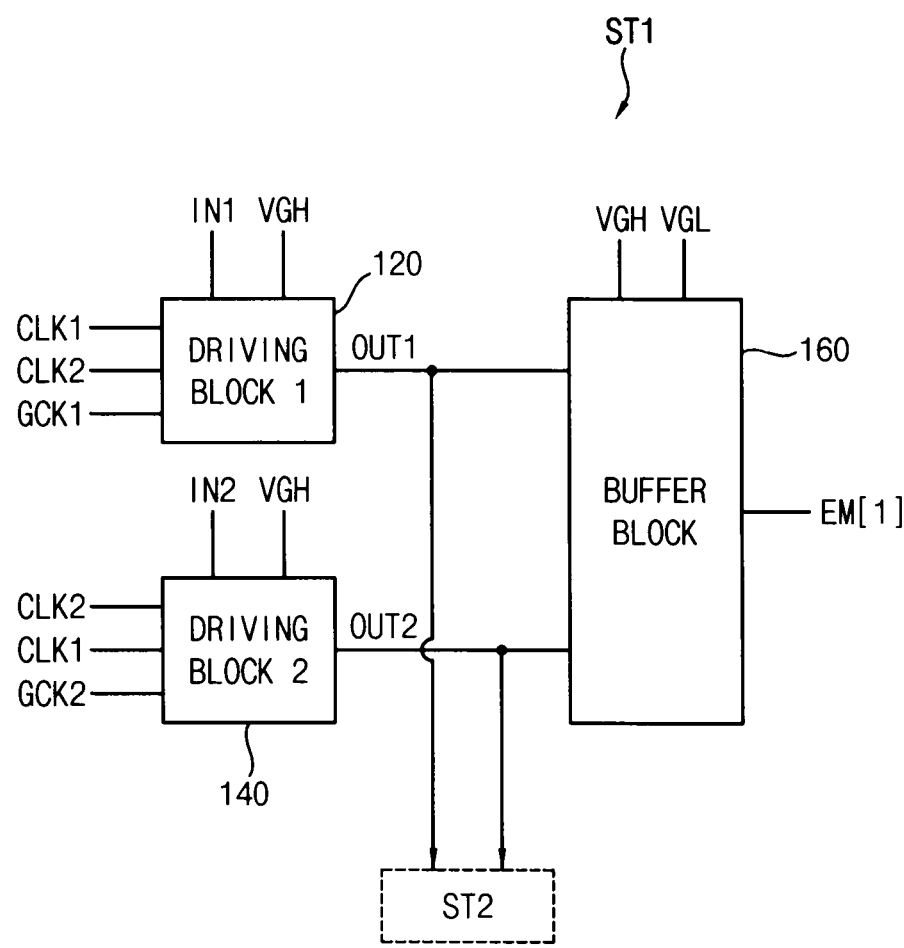
FIG. 2 is a block diagram illustrating an example of a first stage of the emission driver of FIG. 1.

FIG. 2 is a block diagram illustrating an example of a first stage of the emission driver of FIG. 1.

Referring to FIG. 2, the first stage ST1 includes a first driving block 120, a second driving block 140 and a buffer block 160.

The first driving block 120 can receive a first input signal IN1, a first clock signal CLK1, a second clock signal CLK2, and a first driving signal GCK1. The first driving block 120 can output a first intermediate signal OUT1 based at least in part on the first input signal IN1 and the first driving signal GCK1. The first intermediate signal OUT1 can be substantially simultaneously applied to a first input terminal UP of a first driving block of a second stage ST2 and the buffer block 160 of the first stage ST1.

The second driving block 140 can receive a second input signal IN2, the first clock signal CLK1, the second clock signal CLK2, and a second driving signal GCK2. The second driving block 140 can output a second intermediate signal OUT2 based at least in part on the second input signal IN2 and the second driving signal GCK2. The second intermediate signal OUT2 can be substantially simultaneously applied to a second input terminal DN of a second driving block of the second stage ST2 and the buffer block 160 of the first stage ST1.

In the first stage ST1, the first input signal IN1 can correspond to a first start signal (e.g., a first vertical start signal) and the second input signal IN2 can correspond to a second start signal (e.g., a second vertical start signal). The first stage ST1 can receive the first and second start signals from a timing controller included in a display device. In contrast, in a stage except for the first stage ST1, the first input signal IN1 can correspond to the first intermediate signal OUT1 of a previous stage and the second input signal IN2 can correspond to the second intermediate signal OUT2 of the previous stage.

In some embodiments, the first and second driving signals GCK1 and GCK2 are maintained to have the high voltage level when the emission driver 100 operates in the sequential emission mode. For example, in the sequential emission mode, the first and second driving signals GCK1 and GCK2 each having the high voltage level are applied to the first and second driving blocks 120 and 140.

In some embodiments, the first input signal IN1, the second input signal IN2, the first clock signal CLK1, and the second clock signal CLK2 are maintained to have the high voltage level when the emission driver 100 operates in the simultaneous emission mode. For example, in the simultaneous emission mode, the first input signal IN1, the second input signal IN2, the first clock signal CLK1, and the second clock signal CLK2 each having the high voltage level are applied to the first and second driving blocks 120 and 140.

The buffer block 160 can receive the first intermediate signal OUT1 and the second intermediate signal OUT2. The buffer block 160 can output the emission control signal EM[1] based at least in part on a low voltage level of the first intermediate signal OUT1 and the low voltage level of the second intermediate signal OUT2. The buffer block 160 can output the emission control signal EM[1] having a first voltage level based at least in part on the low voltage level of the first intermediate signal OUT1, and can output the emission control signal having a second voltage level lower than the first voltage level based at least in part on the low voltage level of the second intermediate signal OUT2. In some embodiments, a rising edge of the emission control signal EM[1] is substantially synchronized with a falling edge of the first intermediate signal OUT1, and a falling edge of the emission control signal EM[1] is substantially synchronized with a falling edge of the second intermediate signal OUT2.

The buffer block 160 can selectively output the emission control signals to operate in the sequential emission mode or the simultaneous emission mode The buffer block 160 can determine a duration in which the emission control signal EM[1] has a first voltage level based at least in part on an interval between a time point at which the first intermediate signal OUT1 has the low voltage level and a time point at which the second intermediate signal OUT2 has the low voltage level. In some embodiments, in the sequential emission mode, the buffer block 160 adjusts a duty ratio of the emission signal EM[1] based at least in part on an interval between a time point at which the low voltage level of the first input signal IN1 is applied to the first driving block 120 and a time point at which the low voltage level of the second input signal IN2 is applied to the second driving block 140. In some embodiments, in the simultaneous emission mode, the buffer block 160 adjusts the duty ratio of the emission signal EM[1] based at least in part on an interval between a time point at which the low voltage level of the first driving signal GCK1 is applied to the first driving block 120 and a time point at which the low voltage level of the driving signal GCK2 is applied to the second driving block 140.

Figure 3A:
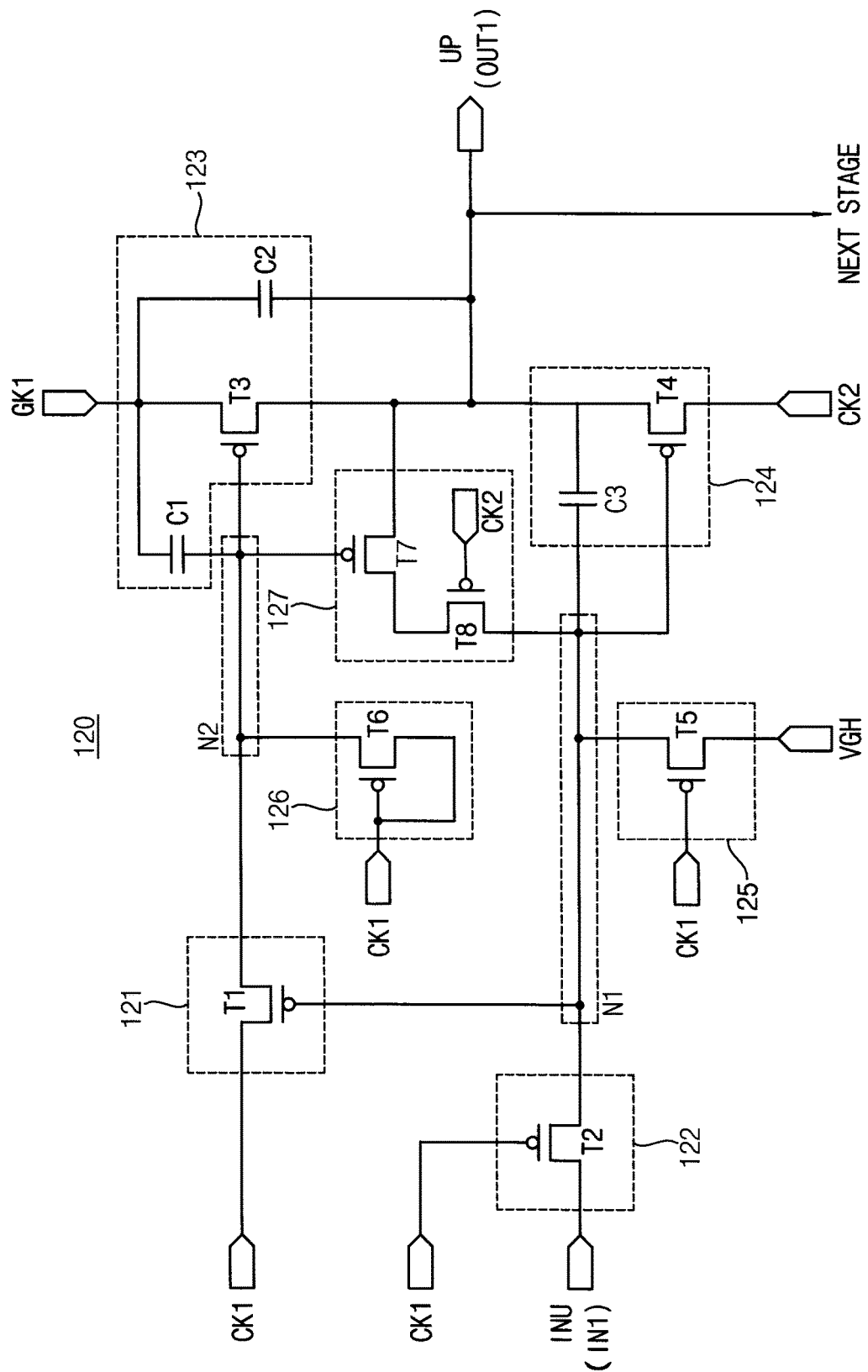
FIG. 3A is a circuit diagram illustrating an example of a first driving block of the stage of FIG. 2.

FIG. 3A is a circuit diagram illustrating an example of a first driving block of the stage of FIG. 2.

Referring to FIGS. 1 and 3A, the first driving block 120 of the first stage ST1 includes first and second input units 121 and 122, pull-up and pull-down units 123 and 124, a driving control unit or driving controller 125, a holding unit 126, and a stabilizing unit 127.

The first input unit 121 can transmit the first clock signal CLK1 to a second node N2 based at least in part on a first node signal applied at a first node CK1. The first input unit 121 can include a first transistor T1 including a gate electrode connected to the first node N1, a source electrode to which the first clock signal CLK1 is applied, and a drain electrode connected to the second node N2. In some embodiments, the first node signal corresponds to a high DC voltage VGH when the emission driver 100 is driven by the simultaneous emission mode.

The second input unit 122 can transmit the first input signal IN1 to the first node N1 based at least in part on the first clock signal CLK1 applied to the first clock terminal CK1. The second input unit 122 can include a second transistor including a gate electrode to which the first clock signal CLK1 is applied, a source electrode to which the first input signal IN1 is applied, and a drain electrode connected to the first node N1.

In some embodiments, the first and second clock signals CLK1 and CLK2 have different timings when the emission driver 100 is driven by the sequential emission mode. For example, the second clock signal CLK2 is a signal inverted from the first clock signal CLK1. A high voltage level period of the second clock signal CLK2 can be at least partially overlapped with a high voltage level period of the first clock signal CLK1.

In some embodiments, the first and second clock signals CLK1 and CLK2 have the high voltage level when the emission driver 100 is driven by the simultaneous emission mode. However, before the emission driver 100 is driven by the simultaneous emission mode, the first and second clock signals CLK1 and CLK2 can have the high voltage level within certain duration for initializing the emission driver 100.

In some embodiments, the first input signal IN1 (i.e., the first start signal) applied to the first stage ST1 has the high voltage level when the emission driver 100 is driven by the simultaneous emission mode.

The pull-up unit 123 can pull up the first intermediate signal OUT1 based at least in part on a second node signal applied at the second node N2. The pull-up unit 123 can include a third transistor T3 including a gate electrode connected to the second node N2, a source electrode to which the first driving signal GCK1 is applied, and a drain electrode connected to a first intermediate signal output terminal UP for outputting the first intermediate signal OUT1. In some embodiments, in the sequential emission mode, the second node signal can correspond to the first clock signal CLK1. In some embodiments, in the simultaneous emission mode, the first node signal corresponds to the first driving signal GCK1.

The pull-up unit 123 can further include a first capacitor C1 including a first end connected to the source electrode of the third transistor T3 and a second end connected to the gate electrode of the third transistor T3. The pull-up unit 123 can further include a second capacitor C2 including a first end connected to the source electrode of the third transistor T3 and a second end connected to the first intermediate signal output terminal UP. The first and second capacitors C1 and C2 can stabilize a pull-up voltage of the first intermediate signal OUT1.

In some embodiments, the first driving signal GCK1 has the low voltage level within a certain duration when the emission driver 100 is driven by the simultaneous emission mode. In contrast, the first driving signal GCK1 can have the high voltage level when the emission driver 100 is driven by the sequential emission mode.

The pull-down unit 124 can pull down the first intermediate signal OUT1 based at least in part on the first node signal. The pull-down unit 124 can include a fourth transistor including a gate electrode connected to the first node N1, a source electrode connected to a second clock terminal CK2 applied to the second clock signal CLK2, and a drain electrode connected to the output terminal UP. The pull-down unit 124 can further include a third capacitor C3 including a first end connected to the source electrode of the fourth transistor T4 and a second end connected to the gate electrode of the fourth transistor T4. The third capacitor C3 can stabilize a pull-down voltage of the first intermediate signal OUT1.

The driving control unit 125 can inactivate the pull-down unit 124 based at least in part on the first driving signal GCK1. The driving control unit 125 can include a fifth transistor T5 including a gate electrode to which the first driving signal GCK1, a source electrode to which a high DC voltage VGH is applied, and a drain electrode connected to the first node N1. The driving control unit 125 can apply the high DC voltage VGH to the first node N1 when the emission driver 100 is driven by a simultaneous emission mode.

The holding unit 126 can maintain the second node signal based at least in part on the first clock signal CLK1. The holding unit 126 can include a sixth transistor T6 including a gate electrode to which the first clock signal CLK1 is applied, a source electrode connected to the gate electrode, and a drain electrode connected to the second node N2. For example, when the first clock signal CLK1 has a high voltage level, the sixth transistor is turned off. When the first clock signal CLK1 has a low voltage level, the second node signal is maintained to have a low voltage level.

The stabilizing unit 127 can stabilize the first intermediate signal OUT1 based at least in part on the second node signal and the second clock signal CLK2. The stabilizing unit 127 can include a seventh transistor T7 and a eighth transistor T8 connected in series to each other. The seventh transistor T7 can include a gate electrode connected to the second node N2, a source electrode to which a pull-up voltage of the first intermediate signal OUT1 (i.e., the first driving signal GCK1) is applied, and a drain electrode connected to a source electrode of the eighth transistor T8. The pull-up voltage can correspond to a voltage applied from the pull-up unit 123. The eighth transistor T8 can include a gate electrode to which the second clock signal CLK2 is applied, the source electrode connected to the drain electrode of the seventh transistor T7, and a drain electrode connected to the first node N1.

When the emission driver 100 is driven by the sequential emission mode, the first driving block 120 can output the first intermediate signal OUT1 based at least in part on the first input signal IN1, the first clock signal CLK1, and the second clock signal CLK2. When the first input signal IN1 having the low voltage level and the first clock signal CLK1 having the low voltage level are applied to the first driving block 120, the first driving block 120 can operate as a shift register and output the first intermediate signal OUT1 delayed about one horizontal period from the first input signal IN1.

When the emission driver 100 is driven by the simultaneous emission mode, the first driving block 120 can output the first intermediate signal OUT1 based at least in part on the first driving signal GCK1. The first intermediate signal OUT1 and the first driving signal GCK1 can have the low voltage level during substantially the same period.

The first intermediate signal OUT1 can be substantially simultaneously applied to the first intermediate signal input terminal UP of the buffer block 160 and a first input terminal of a first driving block of a next stage.

However, the first driving block 120 is not limited thereto. For example, the second input unit 122, the driving control unit 125, and the holding unit 126 respectively have a plurality of transistors connected in series sharing each gate electrode (i.e., a dual gate connected form). Thus, the first driving block 120 can operate more stably.

Figure 3B:
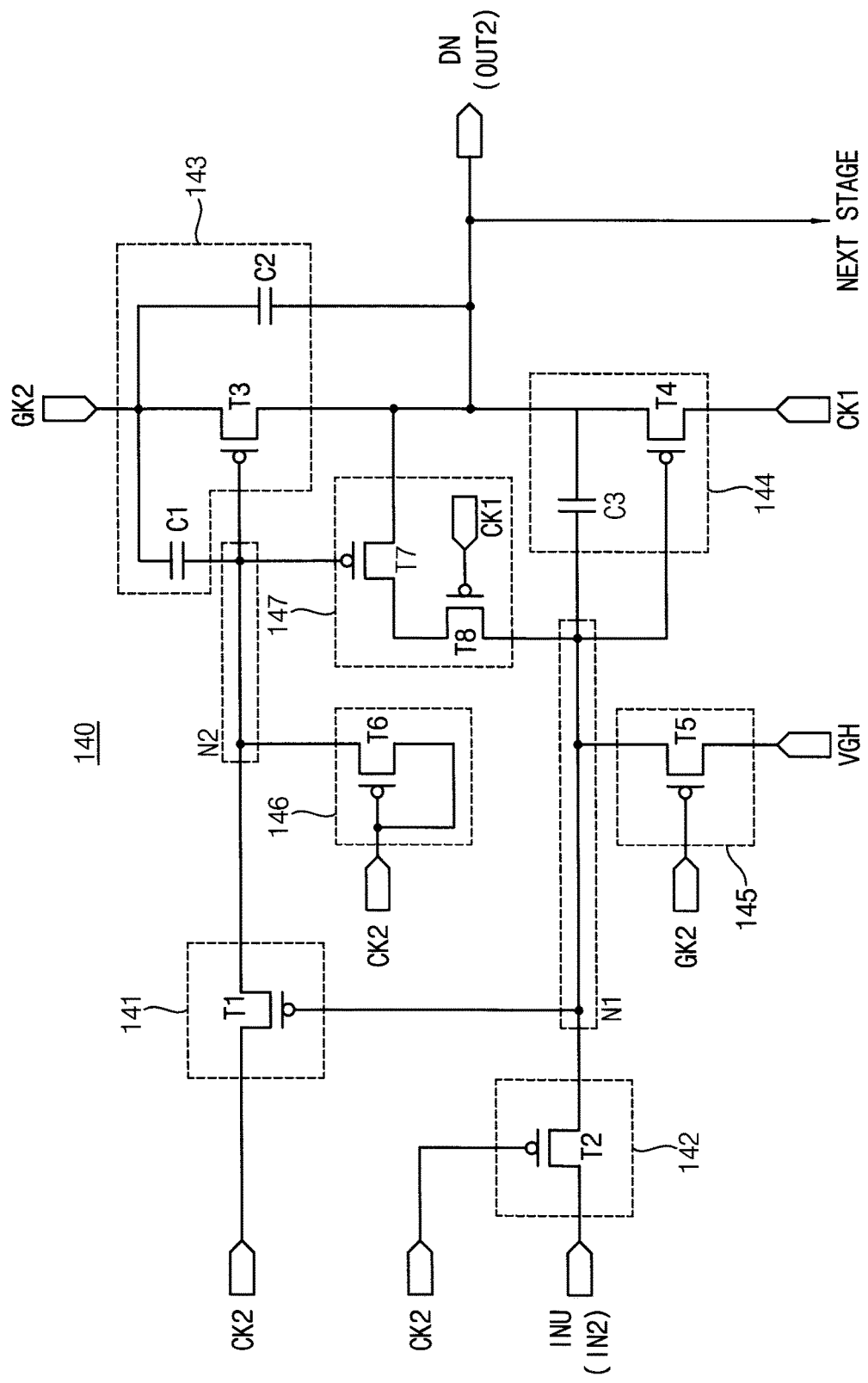
FIG. 3B is a circuit diagram illustrating an example of a second driving block of the stage of FIG. 2.

FIG. 3B is a circuit diagram illustrating an example of a second driving block of the stage of FIG. 2.

Referring to FIGS. 1 and 3B, the second driving block 140 of the first stage ST1 includes a first input unit 141, a second input unit 142, a pull-up unit 143, a pull-down unit 144, a driving control unit 145, a holding unit 146, and a stabilizing unit 147.

As illustrated in FIGS. 3A and 3B, functions of the second driving block 140 and constructions of the second driving block 140 are similar to that of the first driving block 120 described above. Thus, detailed descriptions on elements and/or constructions substantially the same as or similar to the first driving block 120 are omitted.

A second clock terminal CK2 of the second driving block 140 can correspond to the first clock terminal CK1 of the first driving block 120, a first clock terminal CK1 can correspond to the second clock terminal CK2 of the first driving block 120, and a second driving signal input terminal GK2 of the second driving block 140 can correspond to the first driving signal input terminal GK1 of the first driving block 120.

The first input unit 141 can include a first transistor T1 including a gate electrode connected to the first node N1, a source electrode to which the second clock signal CLK2 is applied, and a drain electrode connected to the second node N2.

The second input unit 142 can include a second transistor including a gate electrode to which the second clock signal CLK2 is applied, a source electrode to which the second input signal IN2 is applied, and a drain electrode connected to the first node N1.

The pull-up unit 143 can include a third transistor T3 including a gate electrode connected to the second node N2, a source electrode to which the second driving signal GCK2 is applied, and a drain electrode connected to a second intermediate signal output terminal DN for outputting the second intermediate signal OUT2. The pull-up unit 143 can further include a first capacitor C1 including a first end connected to the source electrode of the third transistor T3 and a second end connected to the gate electrode of the third transistor T3. The pull-up unit 123 can further include a second capacitor C2 including a first end connected to the source electrode of the third transistor T3 and a second end connected to the second intermediate signal output terminal DN.

In some embodiments, the second driving signal GCK2 has the low voltage level within a certain duration when the emission driver 100 is driven by the simultaneous emission mode. In contrast, the second driving signal GCK2 can have the high voltage level when the emission driver 100 is driven by the sequential emission mode.

The pull-down unit 144 can include a fourth transistor including a gate electrode connected to the first node N1, a source electrode connected to the first clock terminal CK1 applied to the first clock signal CLK1, and a drain electrode connected to the second intermediate signal output terminal DN. The pull-down unit 124 can further include a third capacitor C3 including a first end connected to the source electrode of the fourth transistor T4 and a second end connected to the gate electrode of the fourth transistor T4.

The driving control unit 145 can include a fifth transistor T5 including a gate electrode to which the second driving signal GCK2, a source electrode to which a high DC voltage VGH is applied, and a drain electrode connected to the first node N1.

The holding unit 146 can include a sixth transistor T6 including a gate electrode to which the second clock signal CLK2 is applied, a source electrode connected to the gate electrode, and a drain electrode connected to the second node N2.

The stabilizing unit 127 can include a seventh transistor T7 and an eighth transistor T8 connected in series to each other. The seventh transistor T7 can include a gate electrode connected to the second node N2, a source electrode to which a pull-up voltage of the second intermediate signal OUT2 (i.e., the second driving signal GCK2) is applied, and a drain electrode connected to a source electrode of the eighth transistor T8. The pull-up voltage can correspond to a voltage applied from the pull-up unit 123. The eighth transistor T8 can include a gate electrode to which the first clock signal CLK1 is applied, the source electrode connected to the drain electrode of the seventh transistor T7, and a drain electrode connected to the first node N1.

When the emission driver 100 is driven by the sequential emission mode, the second driving block 140 can output the second intermediate signal OUT2 based at least in part on the second input signal IN2 and the first and second clock signals CLK1 and CLK2. When the second input signal IN2 having the low voltage level and the second clock signal CLK2 having the low voltage level are applied to the second driving block 140, the second driving block 140 can operate as a shift register and output the second intermediate signal OUT2 delayed about one horizontal period from the second input signal IN2.

When the emission driver 100 is driven by the simultaneous emission mode, the second driving block 140 can output the second intermediate signal OUT2 based at least in part on the second driving signal GCK2. The second intermediate signal OUT2 and the second driving signal GCK2 can have the low voltage level during substantially the same period.

However, the second driving block 140 is not limited thereto. For example, the second input unit 142, the driving control unit 145, and the holding unit 146 each have a plurality of transistors connected in series sharing each gate electrode (i.e., a dual gate connected form). Thus, the second driving block 140 can operate more stably.

Figure 4:
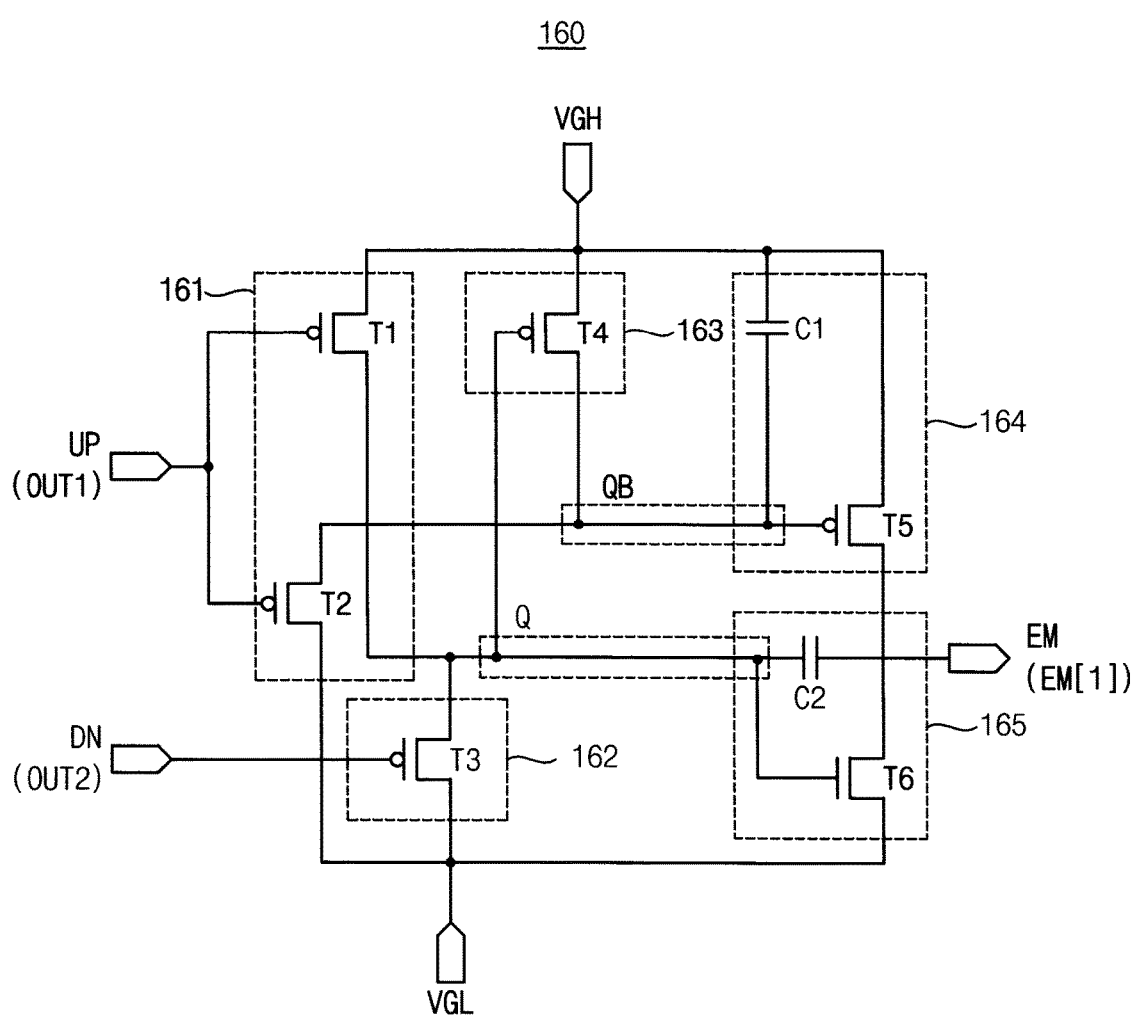
FIG. 4 is a circuit diagram illustrating an example of a buffer block of the stage of FIG. 2.

FIG. 4 is a circuit diagram illustrating an example of the buffer block 160 of the stage of FIG. 2.

Referring to FIGS. 1 and 4, the buffer block 160 includes first and second input units 161 and 162, a holding unit 163, a pull-up unit 164, and a pull-down unit 165.

The buffer block 160 can receive a high DC voltage VGH and a low DC voltage VGL. In this case, the low DC voltage is lower than the high DC voltage.

The first input unit 161 can transmit the high DC voltage VGH to a first node Q based at least in part on the first intermediate signal OUT1 and transmit the low DC voltage VGL to a second node QB based at least in part on the first intermediate signal OUT1. The first input unit 161 can include a first transistor T1 having a gate electrode to which the first intermediate signal OUT1 is applied, a source electrode to which the high DC voltage VGH is applied, and a drain electrode connected to the first node Q. The first input unit 161 can also include a second transistor T2 having a gate electrode to which the first intermediate signal OUT1 is applied, a source electrode to which the low DC voltage VGL is applied, and a drain electrode connected to the second node QB.

The second input unit 162 can transmit the low DC voltage VGL to the first node Q based at least in part on the second intermediate signal OUT2. The second input unit 162 can include a third transistor T3 having a gate electrode to which the second intermediate signal OUT2 is applied, a source electrode to which the low DC voltage VGL is applied, and a drain electrode connected to the first node Q.

The holding unit 163 can maintain a second node signal applied at the second node QB based at least in part on a first node signal applied at the first node Q. The holding unit 163 can include a fourth transistor T4 having a gate electrode connected to the first node Q, a source electrode to which the high DC voltage VGH is applied, and a drain electrode connected to the second node QB. For example, the fourth transistor T4 is turned off when the high DC voltage VGH is applied to the first node Q. The second node voltage is maintained to have the high DC voltage VGH when the low DC voltage VGL is applied to the first node Q.

The pull-up unit 164 can pull up the emission control signal EM[1] based at least in part on the second node signal. The pull-up unit 164 can include a fifth transistor T5 having a gate electrode connected to the second node QB, a source electrode to which the high DC voltage VGH is applied, and a drain electrode connected to an emission control signal output terminal EM for outputting the emission control signal EM[1]. The pull-up unit 164 can further include a first capacitor C1 including a first end connected to the source electrode of the fifth transistor T5 and a second end connected to the gate electrode of the fifth transistor T5. The first capacitor C1 can stabilize a pull-up voltage of the emission control signal EM[1].

In some embodiments, the second node signal corresponds to the high DC voltage VGH or the low DC voltage VGL. Thus, the fifth transistor T5 can be turned off when the high DC voltage VGH is applied to the second node QB. The fifth transistor T5 can be turned on when the low DC voltage VGL is applied to the second node QB. When the fifth transistor T5 is turned on, the pull-up unit 164 can pull up the emission control signal EM[1].

The pull-down unit 165 can pull down the emission control signal EM[1] based at least in part on the first node signal. The pull-down unit 165 can include a sixth transistor T6 having a gate electrode connected to the first node Q, a source electrode to which the low DC voltage VGL is applied, and a drain electrode connected to the emission control signal output terminal EM. The pull-down unit 165 can further include a second capacitor C2 including a first end connected to the gate electrode of the sixth transistor T6 and a second end connected to the gate electrode of the sixth transistor T6. The second capacitor C2 can stabilize a pull-down voltage of the emission control signal EM[1].

In some embodiments, the first node signal corresponds to the high DC voltage VGH or the low DC voltage VGL. Thus, the sixth transistor T6 can be turned off when the high DC voltage VGH is applied to the first node Q. The sixth transistor T6 can be turned on when the low DC voltage VGL is applied to the first node Q. When the sixth transistor T6 is turned on, the pull-down unit 165 can pull down the emission control signal EM[1].

When the first intermediate signal OUT1 having the low voltage level is applied to the buffer block 160, the first and second transistors T1 and T2 can be turned on. Thus, the low DC voltage VGL is applied to the second node QB and the high DC voltage VGH is applied to the first node Q. The fourth and sixth transistors T4 and T6 are turned off and the fifth transistor T5 is turned on such that the buffer block 160 can output the emission control signal EM[1] having a first voltage level (e.g., a high voltage level).

When the second intermediate signal OUT2 having the low voltage level is applied to the buffer block 160, the third and fourth transistors T3 and T4 can be turned on. Thus, the low DC voltage VGL is applied to the first node Q and the high DC voltage VGH is applied to the second node QB. The fifth transistors T5 is turned off and the sixth transistor T6 is turned on such that the buffer block 160 can output the emission control signal EM[1] having a second voltage level (e.g., a low voltage level) lower than the first voltage level.

However, the buffer block 160 is not limited thereto. For example, the first input unit 162 has a plurality of transistors connected in series sharing each gate electrode (i.e., a dual gate connected form). Thus, the buffer block 160 can operate more stably.

As described above, the emission driver 100 according to example embodiments outputs the emission signal selectively and variously to operate in the emission modes (i.e., the sequential emission mode and the simultaneous emission mode) based at least in part on timing of the clock signals CLK1 and CLK2 and the driving signals GCK1 and GCK2. Thus, driving the display device in various display modes (e.g., 3-dimensional (3D) stereoscopic image display mode, etc.) can be simplified and image quality can be improved.

In addition, a duty ratio can be freely controlled by adjusting the timing of the driving signals GCK1 and GCK2 (in the simultaneous emission mode) or the timing of the input signals IN1 and IN2 (in the sequential emission mode).

Figure 5:
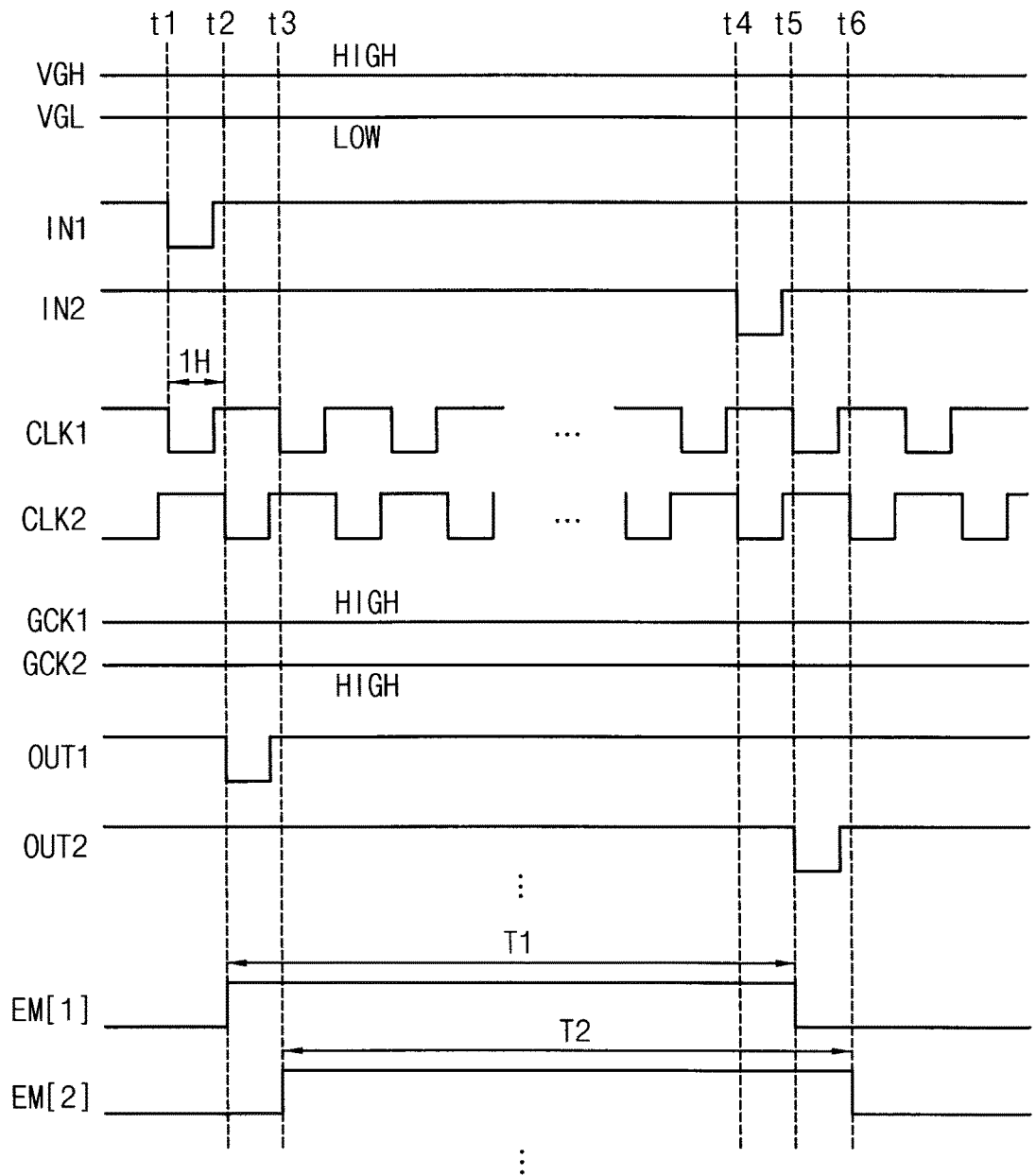
FIG. 5 is a timing diagram illustrating an example of an operation of the emission driver of FIG. 1.

FIG. 5 is a timing diagram illustrating an example of an operation of the emission driver 100 of FIG. 1.

Referring to FIGS. 1 to 5, the emission driver 100 includes the stages connected to one another. Each of the stages can include a first driving block 120, a second driving block 140, and a buffer block 160.

Hereinafter, the operation of the mission driver of FIGS. 5 and 6 will be explained with the emission driver 100 including PMOS (P-channel metal oxide semiconductor) transistors. In contrast, the emission driver 100 can be realized by NMOS (N-channel metal oxide semiconductor) transistors such that the timing diagram can be inverted from the timing diagram of FIGS. 5 and 6.

As illustrated in FIG. 5, the emission driver 100 is driven by the sequential emission mode. In the sequential emission mode, the emission driver 100 can sequentially output emission control signals EM[1], EM[2], . . . .

The first and second driving signals GCK1 and GCK2 can have a high voltage level when the emission driver 100 can be driven by the sequential emission mode.

The first clock signal CLK1 and the second clock signal CLK2 can have a low voltage level pulses that are repeated with a predetermined period. The predetermined period is 2 horizontal periods, however is not limited thereto. In some embodiments, the first and second clock signals CLK1 and CLK2 have a mutual phase difference of ½ cycle (i.e., 1 horizontal period 1H of FIG. 5).

In FIG. 5, the first input signal IN1 and the second input signal are signals applied to the first stage (i.e., the first start signal and the second start signal).

At time t1, the first clock signal CLK1 and the first input signal IN1 can be substantially synchronized and transmitted to the first driving block 120 as the low voltage level. The first driving block 120 can output the first intermediate signal OUT1 based at least in part on the pulse level of the second clock signal CLK2.

When the first input signal IN1 and the first clock signal CLK1 substantially simultaneously have the low voltage level, the first node N1 of the first driving block 120 and the second node N2 of the first driving block 120 can have the low voltage level.

When the second clock signal CLK2 becomes the low voltage level (i.e., at the time t2), the first intermediate signal OUT1 having the low voltage level can be output to the first intermediate signal output terminal UP.

When the second clock signal CLK2 becomes the high voltage level again, the first intermediate signal OUT1 can be changed to the high voltage level and maintained to have the high voltage level.

Thus, the first intermediate signal OUT1 of the low voltage level synchronized with the second clock signal CLK2 of the low voltage level can be output at the time t2. For example, the first intermediate signal OUT1 delayed about 1 horizontal period 1H from the first input signal IN1 is output by an operation of the first driving block 120.

The first intermediate signal OUT1 of the low voltage level can be applied to the buffer block 160 at time t2. At time t2, the buffer block 160 can output the first emission control signal EM[1] as a first voltage level (i.e., a high voltage level) by an operation of the pull-up unit 164. Here, a rising edge of the emission control signal EM[1] can be substantially synchronized with a falling edge of the first intermediate signal OUT1. The first intermediate signal OUT1 can be substantially simultaneously applied to the first driving block of the second stage. A voltage at second node QB of the buffer block 160 (i.e., the second node signal of the buffer block 160) can be maintained to have the low DC voltage VGL by the holding unit 163 such that the first emission control signal EM[1] can be stably maintained to have the first voltage level during a first period T1.

The second stage can be operated substantially same to the operation of the first stage. The second stage can output the first intermediate signal of low voltage level synchronized with the first clock signal CLK1 of the low voltage level at time t3 at which time t3 is delayed about 1 horizontal period from time t2. Further, the second stage can output the second emission control signal EM[2] as the first voltage level (i.e., the high voltage level) at time t3.

At time t4, the second clock signal CLK2 and the second input signal IN2 can be substantially synchronized and transmitted to the second driving block 140 as the low voltage level. The second driving block 140 can output the second intermediate signal OUT2 based at least in part on the pulse level of the first clock signal CLK1.

When the second input signal IN2 and the second clock signal CLK2 substantially simultaneously have the low voltage level, the first and second nodes N1 and N2 of the second driving block 140 can have the low voltage level.

When the first clock signal CLK1 becomes the low voltage level (i.e., at time t5), the second intermediate signal OUT2 having the low voltage level can be output to the second intermediate signal output terminal DN.

When the first clock signal CLK1 becomes the high voltage level again, the second intermediate signal OUT2 can be changed to the high voltage level and maintained to have the high voltage level.

Thus, the second intermediate signal OUT2 of the low voltage level synchronized with the first clock signal CLK1 of the low voltage level can be output at time t5. For example, the second intermediate signal OUT2 delayed about 1 horizontal period 1H from the second input signal IN2 is output by an operation of the second driving block 140.

The second intermediate signal OUT2 of the low voltage level can be applied to the buffer block 160 at time t5. At time t5, the buffer block 160 can output the first emission control signal EM[1] as a second voltage level (i.e., a low voltage level) lower than the first voltage level according to the low DC voltage VGL. At time t5, the first node Q of the buffer block 160 can receive the low DC voltage VGL and the second node QB of the buffer block 160 can receive the high DC voltage VGH. Here, a falling edge of the emission control signal EM[1] can be synchronized with a falling edge of the second intermediate signal OUT2. The second intermediate signal OUT2 can be substantially simultaneously applied to the second driving block 140 of the second stage.

The second stage can be operated substantially the same to the operation of the first stage. The second stage can output the second intermediate signal of the low voltage level synchronized with the second clock signal CLK2 of the low voltage level at time t6. Further, the second stage can output the second emission control signal EM[2] as the second voltage level (i.e., the low voltage level) at time t6. The second emission control signal EM[2] can be stably maintained to have the first voltage level during a second period T2. A length of the second period T2 is substantially the same to a length of the first period T1.

Other stages except for the first and second stages can sequentially output the emission control signals based at least in part on the first and second intermediate signals of previous stage.

As illustrated in FIG. 5, the lengths of the periods T1 and T2 in which the emission control signal has the first voltage level (i.e., the high voltage level) correspond to an interval between a time point at which the first input signal IN1 (or the first intermediate signal OUT1) has the low voltage level and a time point at which the second input signal IN2 (or the second intermediate signal OUT2) has the low voltage level. For example, the lengths of the periods T1 and T2 correspond to a duration between time t1 and time t4 and/or a duration between time t2 and time t5. Thus, the duty ratio of the emission control signal can be controlled by adjusting input timings of the low voltage level of the first and second input signals IN1 and IN2.

Figure 6:
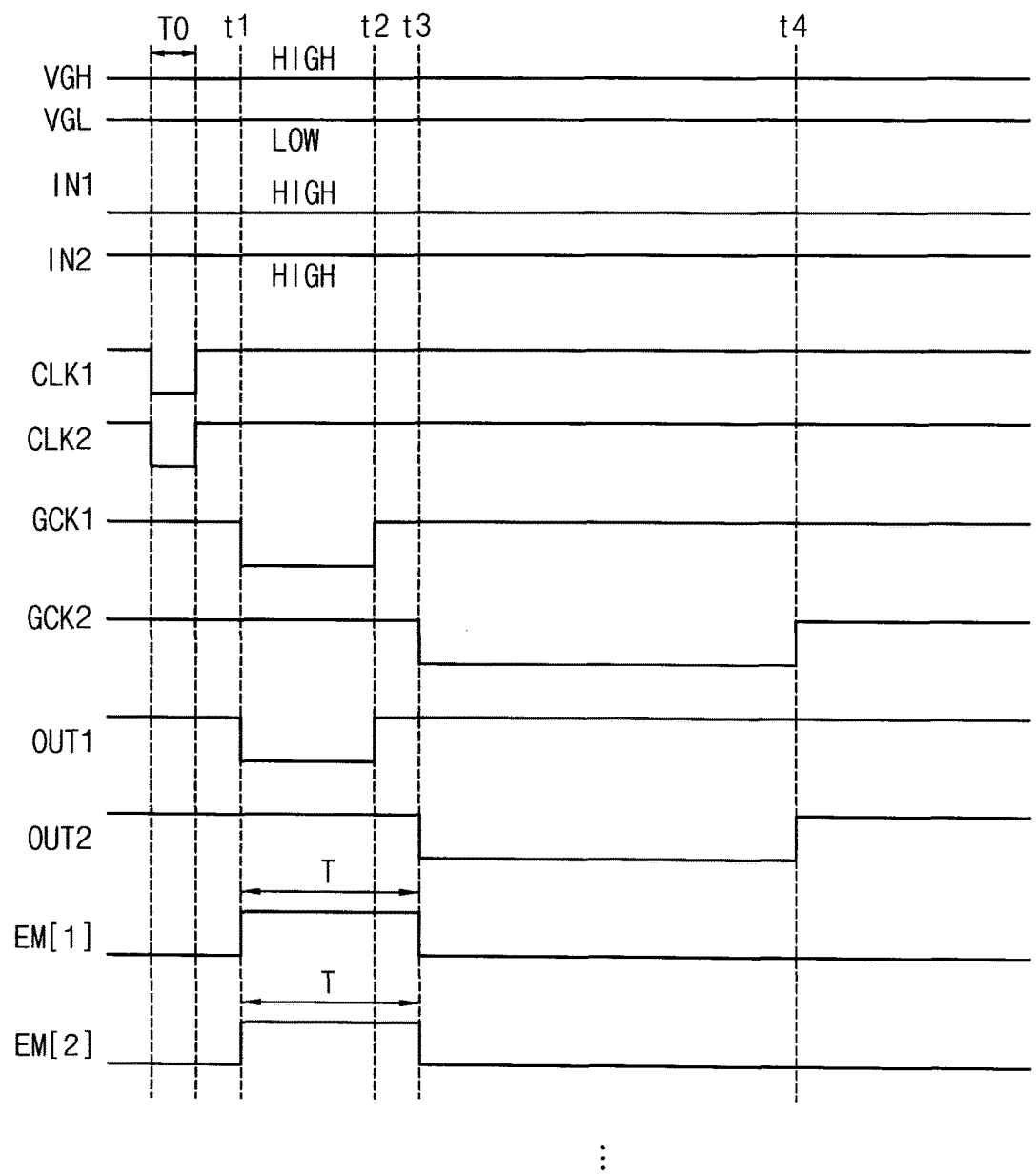
FIG. 6 is a timing diagram illustrating another example of an operation of the emission driver of FIG. 1.

FIG. 6 is a timing diagram illustrating another example of an operation of the emission driver 100 of FIG. 1.

Referring to FIGS. 1 to 4, and 6, the emission driver 100 includes the stages connected to one another. Each of the stages can include a first driving block 120, a second driving block 140, and a buffer block 160.

As illustrated in FIG. 6, the emission driver 100 can be driven by the simultaneous emission mode. In the simultaneous emission mode, the emission driver 100 can sequentially output emission control signals EM[1], EM[2], . . . .

The first and second input signals IN1 and IN2 can always have a high voltage level when the emission driver 100 is driven by the simultaneous emission mode. The first and the second clock signals CLK1 and CLK2 can have the high voltage level, also. Thus, the first input unit 121, the second input unit 122, the holding unit 126, and the stabilizing unit 146 of the first driving block 120 are not operated.

The first and second driving signals GCK1 and GCK2 can have a low voltage level within a predetermined duration. Here, a low voltage level period of the first driving signal GCK1 is not overlapped with a low voltage level period of the second driving signal GCK2. In some embodiments, before the emission driver 100 is driven by the simultaneous emission mode (i.e., before the time t1), the first and second clock signals CLK1 and CLK2 substantially simultaneously have the high voltage level within duration T0. Thus, the first driving block 120 and the second driving block 140 can be initialized.

In a period between time t1 and time t2, the first driving signal GCK1 having the low voltage level can be substantially simultaneously applied to first driving blocks 120 of all stages. The first and second clock signals CLK1 and CLK2 have the high voltage level such that the first driving blocks 120 can respectively output the first intermediate signals OUT1 having the same timing as the first driving signal GCK1.

For example, when the first driving signal GCK1 has the low voltage level, the first node N1 of the first driving block 120 has the high voltage level, and the second node N2 of the first driving block 120 has the low voltage level. The pull-up unit 123 of the first driving block 120 can generate the first intermediate signal OUT1 of the low voltage level according to the first driving signal GCK1 based at least in part on the second node signal having the low voltage level. When the first driving signal GCK1 is changed to the high voltage level, the high voltage level can be applied to the second node N2 such that the first intermediate signal OUT1 can be changed to the high voltage level.

At time t1, the first intermediate signal OUT1 of the low voltage level can be applied to the buffer blocks 160 such that each buffer block 160 respectively output the emission control signals EM[1], EM[2], . . . as the first voltage level. At time t1, the first transistor T1 of the first input unit 161 is turned on such that the high DC voltage VGH is applied to the first node Q of the buffer block 160. The second transistor T2 of the first input unit 161 is turned on such that the low DC voltage VGL is applied to the second node QB of the buffer block 160. Here, a rising edge of the emission control signals EM[1], EM[2], . . . can be substantially synchronized with a falling edge of the first intermediate signals OUT1. A voltage at the second node QB of the buffer block 160 (i.e., the second node signal of the buffer block) can be maintained to have the low DC voltage VGL by the holding unit 163 such that the emission control signals EM[1], EM[2], . . . can be stably maintained to have the first voltage level (i.e., a high voltage level) during a first period T In a period between time t3 and time t4, the second driving signal GCK2 having the low voltage level can be substantially simultaneously applied to second driving blocks 140 of all stages. The first and second clock signals CLK1 and CLK2 have the high voltage level such that the second driving blocks 140 can respectively output the second intermediate signals OUT2 having substantially the same timing as the second driving signal GCK2.

For example, when the second driving signal GCK2 has the low voltage level, the first node N1 has the high voltage level, and the second node N2 has the low voltage level. The pull-up unit 143 can generate the second intermediate signal OUT2 of the low voltage level based at least in part on the second driving signal GCK2 based at least in part on the second node signal having the low voltage level. When the second driving signal GCK2 is changed to the high voltage level, the high voltage level can be applied to the second node N2 such that the second intermediate signal OUT2 can be changed to the high voltage level.

At time t3, the second intermediate signal OUT2 of the low voltage level can be applied to the buffer blocks 160 such that each buffer block 160 respectively outputs the emission control signals EM[1], EM[2], . . . as the second voltage level lower than the first voltage level. At time t3, the third transistor T3 of the second input unit 162 is turned on such that the low DC voltage VGL is applied to the first node Q of the buffer block 160. The fourth transistor T4 of the holding unit 163 is turned on such that the high DC voltage VGH is applied to the second node QB of the buffer block 160. Thus, the pull-down unit 165 can be turned on such that the emission control signals EM[1], EM[2], . . . are pulled down as the second voltage level. Here, a falling edge of the emission control signals EM[1], EM[2], . . . can be substantially synchronized with a falling edge of the second intermediate signals OUT2.

As described above, the stages in the emission driver 100 can substantially simultaneously receive the first and second driving signals GCK1 and GCK2 so that the stages can substantially simultaneously output the emission control signals EM[1], EM[2], . . . .

A length of the period T in which the emission control signals EM[1], EM[2], . . . have the first voltage level (i.e., the high voltage level) can correspond to a time interval between a time point at which the first driving signal GCK1 (or the first intermediate signal OUT1) has the low voltage level and a time point at which the second driving signal GCK2 (or the second intermediate signal OUT2) has the low voltage level. For example, the length of the period T corresponds to a duration between time t1 and time t3. Thus, the duty ratio of the emission control signal can be controlled by adjusting falling timings of the first and second driving signals GCK1 and GCK2.

Figure 7:
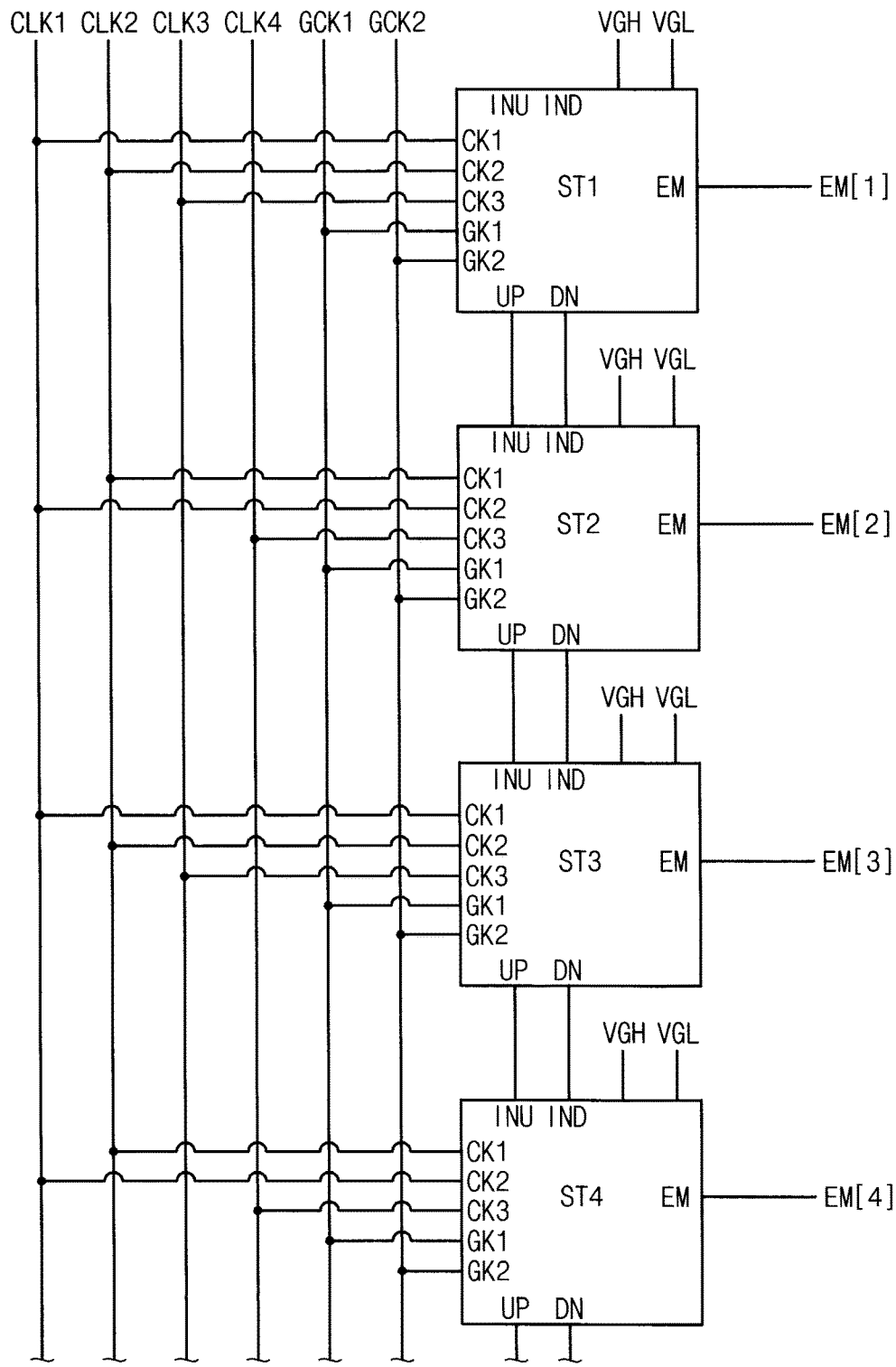
FIG. 7 is a block diagram of an emission driver according to example embodiments.
Figure 8:
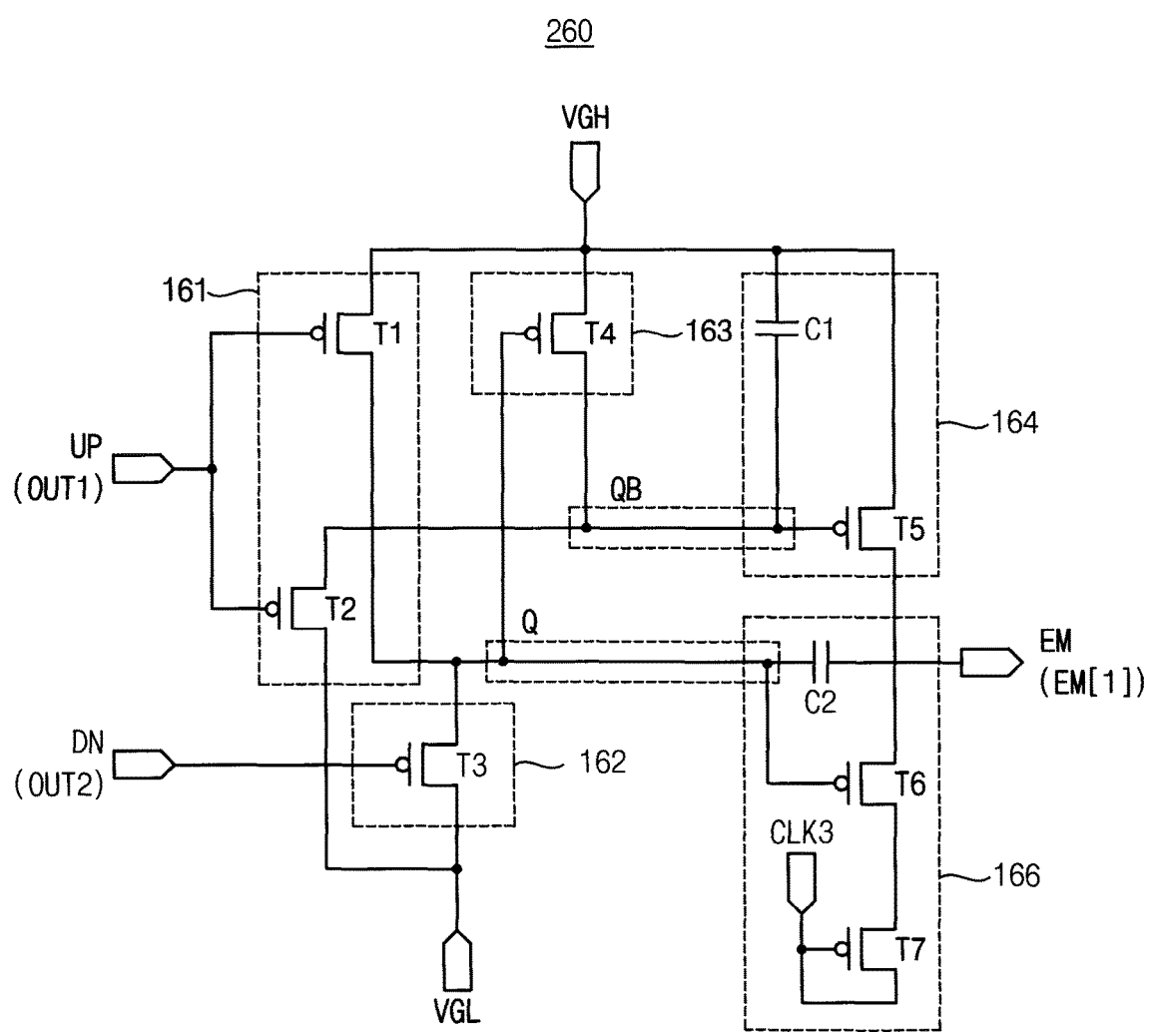
FIG. 8 is a circuit diagram illustrating an example of a buffer block included in each stage of the emission driver of FIG. 7.

FIG. 7 is a block diagram of an emission driver according to example embodiments. FIG. 8 is a circuit diagram illustrating an example of a buffer block included in each stage of the emission driver of FIG. 7.

The emission driver and the method of driving the emission driver of the present example embodiments are substantially the same as the emission driver and the method of driving the emission driver explained with reference to FIGS. 1 to 6 except for constructions of the pull-down unit of the buffer block. Thus, the same reference numerals will be used to refer to the same or like parts as those described in the example embodiments of FIGS. 1 to 6, and any repetitive explanation concerning the above elements will be omitted.

Referring to FIGS. 1, 2, 7, and 8, the emission driver 200 includes a plurality of stages ST1, ST2, ST3, ST4, . . . connected to one another.

As illustrated in FIG. 7, each of the stages ST1, ST2, ST3, ST4, . . . includes first to third clock terminals CK1 to CK3, first and second driving signal input terminals GK1 and GK2, a first input terminal INU, a second input terminal IND, a first intermediate signal output terminal UP, a second intermediate signal output terminal DN, and an emission control signal output terminal EM. Each of the stages ST1, ST2, ST3, ST4, . . . can further include a high DC voltage input terminal VGH and a low DC voltage input terminal VGL.

In some embodiments, the first and second clock signals CLK1 and CLK2 having different timings are respectively applied to the first and second clock terminal CK1 and CK2.

For example, the second clock signal CLK2 is a signal inverted from the first clock signal CLK1.

A third clock signal CLK3 or a fourth clock signal CLK4 can be applied to the third clock terminal CK3 in the buffer block 160. For example, the third clock signal CLK3 is applied to the third clock terminal CK3 of odd-numbered stages ST1, ST3, . . . . In contrast, the fourth clock signal CLK4 can be applied to the third clock terminal CK3 of even-numbered stages ST2, ST4, . . . . In some embodiments, the third clock signal CLK3 and the second clock signal CLK2 can have substantially the same timing, and the fourth clock signal CLK4 and the first clock signal CLK1 can have substantially the same timing.

Each stage of the emission driver 200 can include a first driving block 120, a second driving block 140 and a buffer block 260. Since the first driving block 120 and the second driving block 140 are described above referring to FIGS. 2 to 3B, duplicated descriptions will not be repeated.

As illustrated in FIG. 8, the buffer block 260 includes first and second input units 161 and 162, a holding unit 163, a pull-up unit 164, and a pull-down unit 166.

The first input unit 161 can transmit the high DC voltage VGH to a first node Q based at least in part on the first intermediate signal OUT1 and transmit the low DC voltage VGL to a second node QB based at least in part on the first intermediate signal OUT1.

The second input unit 162 can transmit the low DC voltage VGL to the first node Q based at least in part on the second intermediate signal OUT2.

The holding unit 163 can maintain a second node signal applied at the second node QB based at least in part on a first node signal applied at the first node Q.

The pull-up unit 164 can pull up the emission control signal EM[1] based at least in part on the second node signal.

The pull-down unit 166 can pull down the emission control signal EM[1] based at least in part on the first node signal. In some embodiments, the pull-down unit 166 includes a first pull-down transistor T6 and a second pull-down transistor T7 connected in series to each other. The first pull-down transistor T6 can include a gate electrode connected to the first node Q, a source electrode connected to a drain electrode of the second pull-down transistor T7, and a drain electrode connected to an emission control signal output terminal EM. The second pull-down transistor T6 can be a diode-connected transistor. The second pull-down transistor T6 can include a gate electrode to which a third clock signal CLK3 is applied, the source electrode connected to the gate electrode, and the drain electrode connected to the source electrode of the first pull-down transistor T6.

In the sequential emission mode, the pull-down unit 166 can pull down the emission control signal when the first pull down transistor T6 is turned on. The third clock signal CLK3 and the second clock signal CLK2 can have substantially the same timing. When the third clock signal CLK3 changes to the low voltage level, the first node Q is bootstrapped by the capacitor C2 of the pull-down unit 166 so that the signal at the first node Q has the second low voltage level lower than the low voltage level. Thus, a falling speed of the emission control signal (i.e., a pull down speed) can increase.

The fourth clock signal CLK4 can be applied to the pull-down unit of the buffer block in the second stage ST2 adjacent to the first stage ST1. The fourth clock signal CLK4 and the first clock signal CLK1 can have substantially the same timing. For example, the third clock signal CLK3 is applied to the third clock terminal CK3 of odd-numbered stages ST1, ST3, . . . . In contrast, the fourth clock signal CLK4 can be applied to the third clock terminal CK3 of even-numbered stages ST2, ST4, . . . .

In the simultaneous emission mode, the third and fourth clock signals CLK3 and CLK4 can have the low voltage level. Thus, the third and fourth clock signals CLK3 and CLK4 can act as the low DC voltage VGL.

As described above, the emission driver of FIGS. 7 and 8 can improve the falling speed of the emission control signals when the emission driver is driven by the sequential emission mode. Thus, image quality can be improved.

Figure 9:
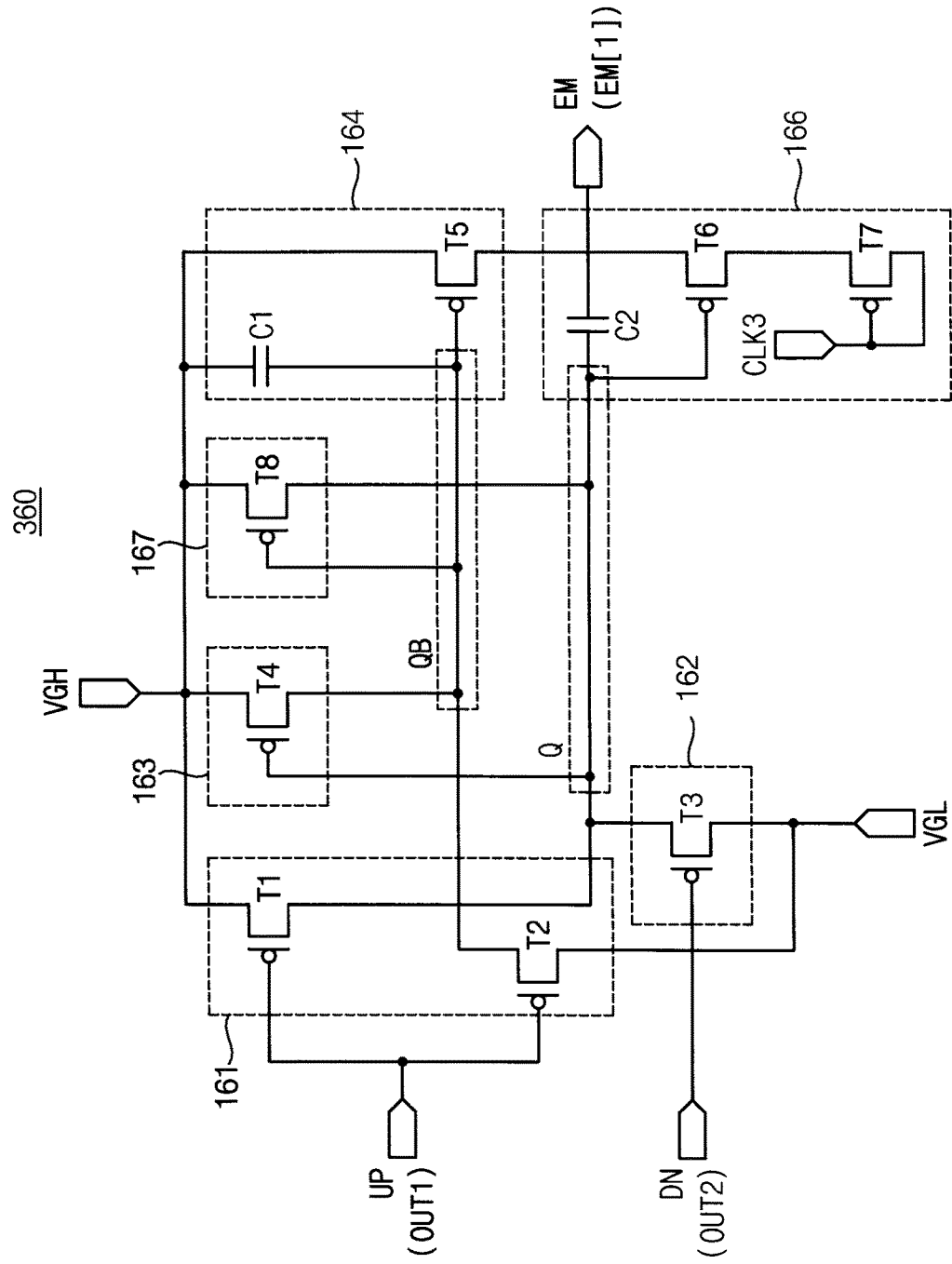
FIG. 9 is a circuit diagram illustrating another example of a buffer block included in each stage of the emission driver of FIG. 7.

FIG. 9 is a circuit diagram illustrating another example of a buffer block included in each stage of the emission driver 200 of FIG. 7.

The buffer block of the present example embodiments are substantially the same as the buffer block explained with reference to FIGS. 7 and 8 except for constructions of the holding unit of the buffer block. Thus, the same reference numerals will be used to refer to the same or like parts as those described in the example embodiments of FIGS. 1 to 8, and any repetitive explanation concerning the above elements will be omitted.

Referring to FIG. 9, the buffer block 360 includes first and second input units 161 and 162, first and second holding units 166 and 167, a pull-up unit 164, and a pull-down unit 166.

The second holding unit 167 can maintain a first node signal applied at the first node Q based at least in part on a second node signal applied at the second node QB. The second holding unit 167 can include a holding transistor T8 having a gate electrode connected to the second node QB, a source electrode to which the high DC voltage VGH is applied, and a drain electrode connected to the first node Q.

The second node signal applied at the second node QB can be the low DC voltage VGL during the emission control signal EM[1] output as the first voltage level (i.e. high voltage level) so that the holding transistor T8 can be turned on and the high DC voltage VGH can be applied to the first node Q. Thus, even if the buffer block 360 includes transistors having a large leakage current, the buffer block 360 can stably operate by the second holding unit 167. Further, the pull-down unit 166 can be turned off within a sufficient time period.

As illustrated in FIG. 9, the pull-down unit 166 can include a first pull down transistor T6 and a second pull down transistor T7. However, constructions of the buffer pull-down unit 166 are not limited thereto. For example, the pull-down unit 166 includes one pull down transistor connected to the low DC voltage VGL.

Figure 10:
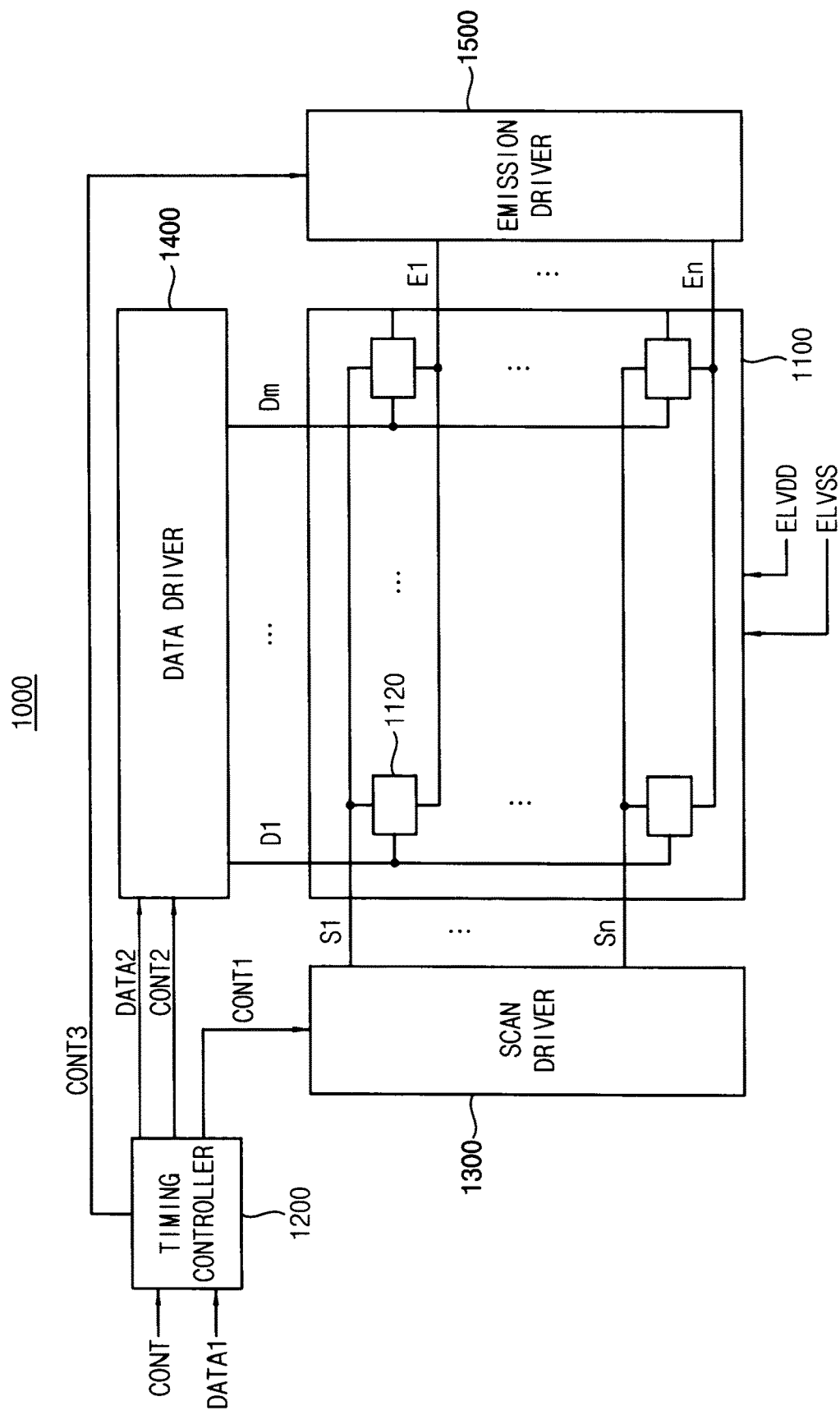
FIG. 10 is a block diagram of a display device according to example embodiments.

FIG. 10 is a block diagram of a display device according to example embodiments.

Referring to FIG. 10, the display device 1000 can include a display panel 1100, a timing controller 1200, a gate driver 1300, a data driver 1400, and an emission driver 1500.

For example, the display device 1000 is an organic light-emitting diode (OLED) display. Alternatively, the display device 1000 can be a liquid crystal display (LCD).

The display panel 1100 can display an image. The display panel 110 can include a plurality of scan lines S1 to Sn, a plurality of data lines D1 to Dm, a plurality of emission control lines E1 to En, and a plurality of sub-pixels 1120 connected to the scan lines S1 to Sn, the data lines D1 to Dm, and the emission control lines E1 to En. For example, the sub-pixels 1120 are formed in a matrix form.

The timing controller 1200 can receive an input control signal CONT and an input image signal DATA1 from an image source such as an external graphic apparatus. The input control signal CONT can include a main clock signal, a vertical synchronizing signal, a horizontal synchronizing signal, and a data enable signal. The timing controller 1200 can generate a data signal DATA2 which has a digital type and corresponds to operating conditions of the display panel 1100 based at least in part on the input image signal DATA1. In addition, the timing controller 1200 can generate a first control signal CONT1 for controlling a driving timing of the scan driver 1300, a second control signal CONT2 for controlling a driving timing of the data driver 1400, and a third control signal CONT3 for controlling the emission driver 1500 based at least in part on the input control signal CONT. The timing controller 1200 can respectively output the first to third control signals CONT1, CONT2, and CONT3 to the scan driver 1300, the data driver 1400, and emission driver 1500.

The scan driver 1300 can include a plurality of scan stages outputting a plurality of scan signals to the display panel 1100 through the scan lines S1 to Sn, respectively. The scan driver 1300 can apply the scan signals to the scan lines S1 to Sn based at least in part on the first control signal CONT1 receiving from the timing controller 1200.

The data driver 1400 can output a plurality of data signals to the display panel 1100 through the data lines D1 to Dm. The data driver 1400 can apply the data signals to the data lines D1 to Dm based at least in part on the second control signal CONT2 and the data signal DATA2 receiving from the timing controller 1200.

The emission driver 1500 can include a plurality of stages outputting a plurality of emission control signals to the display panel 110 through the emission control lines E1 to En. The stages of the present example embodiments are substantially the same as the stages explained with reference to FIGS. 1 and 9. The emission drier 1500 can apply the emission control signals to the emission control lines E1 to En based at least in part on the third control signal receiving from the timing controller 1200. The emission driver 1500 can adjust output of the emission control signals such that the emission driver 1500 controls light emission of the sub-pixels 1120 based at least in part on the emission mode (e.g., the simultaneous emission mode and the sequential emission mode).

Each of the stages of the emission driver 1500 can include a first driving block receiving a first input signal, first and second clock signals, and a first driving signal The first driving block can output a first intermediate signal based at least in part on the first input signal and the first driving signal, a second driving block receiving a second input signal, the first clock signal, the second clock signal, and a second driving signal. The first driving block can also output a second intermediate signal based at least in part on the second input signal and the second driving signal, and a buffer block receiving the first intermediate signal and the second intermediate signal. The first driving block can further output one of an emission control signal based at least in part on the first intermediate signal and the second intermediate signal.

The first and second driving signals can be applied to all the stages substantially simultaneously.

Since constructions and operations of the emission driver 1500, the first driving block, the second driving block, and the buffer block are explained with reference to FIGS. 1 to 9, duplicated descriptions will not be repeated.

The first and second driving signals can have a high voltage level when the emission driver 1500 can be driven by a sequential emission mode. Thus, the emission driver 1500 can sequentially output the emission control signals based at least in part on timings of the first and second clock signals. Here, the emission driver 1500 can adjust a time interval between a time point at which the first input signal falls to the low voltage level and a time point at which the second input signal falls to the low voltage level, so that a duty ratio of the emission control signals can be controlled. For example, the duty ratio is adjusted by a time interval between a time point at which the first intermediate signal falls to the low voltage level and a time point at which the second intermediate signal falls to the low voltage level.

The first and second clock signals can have a high voltage level when the emission driver 1500 can be driven by the simultaneous emission mode. Thus, the emission driver 1500 can substantially simultaneously output the emission control signals based at least in part on a low voltage level of the first and second driving signals. Here, the emission driver 1500 can adjust a time interval between a time point at which the first driving signal falls to the low voltage level and a time point at which the second driving signal falls to the low voltage level, so that a duty ratio of the emission control signals can be controlled. For example, the duty ratio is adjusted by an interval between a time point at which the first intermediate signal falls to the low voltage level and a time point at which the second intermediate signal falls to the low voltage level.

As described above, the display panel 1000 according to example embodiments controls timing of the clock signals and the driving signals such that the emission driver 1500 outputs the emission signals selectively and variously to operate in the respective emission modes. Thus, operations corresponding to the emission modes can be simplified and image quality can be improved. Further, a falling speed of the emission control signal (i.e., a pull down speed) can be improved by an operation and a circuit configuration of the buffer block.

In addition, a duty ratio can be freely controlled by adjusting the timing of the driving signals (in the simultaneous emission mode) or the timing of the input signals (in the sequential emission mode).

The present embodiments can be applied to any display device driven by the simultaneous emission mode and the sequential emission mode and any system including the display device. For example, the described technology can be applied to OLED displays and a LCDs, or it can be applied to televisions, computer monitors, laptop computers, digital cameras, cellular phones, smartphones, personal digital assistants (PDA), portable multimedia players (PMP), MP3 players, navigation systems, video phones, etc.

The foregoing is illustrative of example embodiments, and is not to be construed as limiting thereof. Although a few example embodiments have been described, those skilled in the art will readily appreciate that many modifications are possible in the example embodiments without materially deuniting from the novel teachings and advantages of example embodiments. Accordingly, all such modifications are intended to be included within the scope of example embodiments as defined in the claims. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. An emission driver for a display device, the emission driver comprising a plurality of stages each configured to output an emission control signal,
    wherein each of the stages includes:
        a first driving block configured to i) receive a first input signal, first and second clock signals, and a first driving signal, and ii) output a first intermediate signal based at least in part on the first input signal and the first driving signal;
        a second driving block configured to i) receive a second input signal, the first and second clock signals, and a second driving signal, and ii) output a second intermediate signal based at least in part on the second input signal and the second driving signal; and
        a buffer block configured to i) receive the first and second intermediate signals, and ii) output an emission control signal based at least in part on the first and second intermediate signals,
    wherein the buffer block is further configured to selectively output the emission control signal so as to operate in a sequential emission mode or in a simultaneous emission mode, wherein the stages are configured to i) sequentially output a plurality of the emission control signals in the sequential emission mode and ii) substantially simultaneously output the emission control signals in the simultaneous emission mode,
    wherein the buffer block is further configured to determine a duration in which the emission control signal has a first voltage level based at least in part on an interval between a time point when the first intermediate signal has a low voltage level and a time point when the second intermediate signal has the low voltage level, and
    wherein the first driving block includes i) a first input unit configured to transmit the first clock signal to a second node based at least in part on a first node signal configured to be applied to a first node and ii) a stabilizing unit configured to stabilize the first intermediate signal based at least in part on a second node signal and the second clock signal, the second node signal being applied to the second node.

2. The emission driver of claim 1, wherein the buffer block is further configured to output i) the emission control signal having the first voltage level when the first intermediate signal has the low voltage level and ii) the emission control signal having a second voltage level lower than the first voltage level when the second intermediate signal has the low voltage level.

3. The emission driver of claim 2, wherein a rising edge of the emission control signal is substantially synchronized with a falling edge of the first intermediate signal, and wherein a falling edge of the emission control signal is substantially synchronized with a falling edge of the second intermediate signal.

4. The emission driver of claim 2, wherein the first and second driving signals are configured to be maintained to have a high voltage level when the emission driver operates in the sequential emission mode, and wherein the first and second input signals and the first and second clock signals are configured to be maintained to have the high voltage level when the emission driver operates in the simultaneous emission mode.

5. The emission driver of claim 1, wherein the first driving block further includes:

a second input unit configured to transmit the first input signal to the first node based at least in part on the first clock signal;

a pull-up unit configured to pull up the first intermediate signal based at least in part on the second node signal configured to be applied to the second node;

a pull-down unit configured to pull down the first intermediate signal based at least in part on the first node signal;

a driving controller configured to inactivate the pull-down unit based at least in part on the first driving signal; and a holding unit configured to maintain the second node signal based at least in part on the first clock signal.

6. The emission driver of claim 5, wherein the first input unit includes a first transistor having a gate electrode electrically connected to the first node, a source electrode to which the first clock signal is configured to be applied, and a drain electrode electrically connected to the second node, wherein the second input unit includes a second transistor having a gate electrode to which the first clock signal is configured to be applied, a source electrode to which the first input signal is configured to be applied, and a drain electrode electrically connected to the first node, wherein the pull-up unit includes a third transistor having a gate electrode electrically connected to the second node, a source electrode to which the first driving signal is configured to be applied, and a drain electrode electrically connected to an output terminal configured to output the first intermediate signal, wherein the pull-down unit includes a fourth transistor having a gate electrode electrically connected to the first node, a source electrode to which the second clock signal is configured to be applied, and a drain electrode electrically connected to the output terminal, wherein the driving controller includes a fifth transistor having a gate electrode to which the first driving signal is configured to be applied, a source electrode to which a high DC voltage is configured to be applied, and a drain electrode electrically connected to the first node, and wherein the holding unit includes a sixth transistor having a gate electrode and a source electrode to which the first clock is configured to be applied, and a drain electrode electrically connected to the second node.

7. The emission driver of claim 5, wherein the stabilizing unit includes seventh and eighth transistors electrically connected in series, wherein the seventh transistor includes a gate electrode electrically connected to the second node, a source electrode to which a pull-up voltage of the first intermediate signal is configured to be applied, and a drain electrode electrically connected to a source electrode of the eighth transistor, and wherein the eighth transistor includes a gate electrode to which the second clock signal is configured to be applied, a source electrode electrically connected to the drain electrode of the seventh transistor, and a drain electrode electrically connected to the first node.

8. The emission driver of claim 1, wherein the second driving block includes:

a first input unit configured to transmit the second clock signal to a second node based at least in part on a first node signal configured to be applied to a first node;

a second input unit configured to transmit the second input signal to the first node based at least in part on the second clock signal;

a pull-up unit configured to pull up the second intermediate signal based at least in part on a second node signal configured to be applied to the second node;

a pull-down unit configured to pull down the second intermediate signal based at least in part on the first node signal;

a driving controller configured to inactivate the pull-down unit based at least in part on the second driving signal;

a holding unit configured to maintain the second node signal based at least in part on the second clock signal; and a stabilizing unit configured to stabilize the second intermediate signal based at least in part on the second node signal and the first clock signal.

9. The emission driver of claim 8, wherein the first input unit includes a first transistor having a gate electrode electrically connected to the first node, a source electrode to which the second clock signal is configured to be applied, and a drain electrode electrically connected to the second node, wherein the second input unit includes a second transistor having a gate electrode to which the second clock signal is configured to be applied, a source electrode to which the second input signal is configured to be applied, and a drain electrode electrically connected to the first node, wherein the pull-up unit includes a third transistor having a gate electrode electrically connected to the second node, a source electrode to which the second driving signal is configured to be applied, and a drain electrode electrically connected to an output terminal configured to output the second intermediate signal, wherein the pull-down unit includes a fourth transistor having a gate electrode electrically connected to the first node, a source electrode to which the first clock signal is configured to be applied, and a drain electrode electrically connected to the output terminal, wherein the driving controller includes a fifth transistor having a gate electrode to which the second driving signal is configured to be applied, a source electrode to which a high DC voltage is configured to be applied, and a drain electrode electrically connected to the first node, and wherein the holding unit includes a sixth transistor having a gate electrode and a source electrode to which the second clock is configured to be applied, and a drain electrode electrically connected to the second node.

10. The emission driver of claim 1, wherein the buffer block includes:

a first input unit configured to transmit i) a high DC voltage to a first node based at least in part on the first intermediate signal and ii) a low DC voltage to a second node based at least in part on the first intermediate signal;

a second input unit configured to transmit the low DC voltage to the first node based at least in part on the second intermediate signal;

a first holding unit configured to maintain a second node signal configured to be applied to the second node based at least in part on a first node signal configured to be applied to the first node;

a pull-up unit configured to pull up the emission control signal based at least in part on the second node signal; and a pull-down unit configured to pull down the emission control signal based at least in part on the first node signal.

11. The emission driver of claim 10, wherein the first input unit includes:
- a first transistor having a gate electrode to which the first intermediate signal is configured to be applied, a source electrode to which the high DC voltage is configured to be applied, and a drain electrode electrically connected to the first node; and
- a second transistor having a gate electrode to which the first intermediate signal is configured to be applied, a source electrode to which the low DC voltage is configured to be applied, and a drain electrode electrically connected to the second node.

12. The emission driver of claim 11, wherein the second input unit includes a third transistor having a gate electrode to which the second intermediate signal is configured to be applied, a source electrode to which the low DC voltage is configured to be applied, and a drain electrode electrically connected to the first node,
- wherein the first holding unit includes a fourth transistor having a gate electrode electrically connected to the first node, a source electrode to which the high DC voltage is configured to be applied, and a drain electrode electrically connected to the second node,
- wherein the pull-up unit includes a fifth transistor having a gate electrode electrically connected to the second node, a source electrode to which the high DC voltage is configured to be applied, and a drain electrode electrically connected to an emission control signal output terminal configured to output the emission control signal, and
- wherein the pull-down unit includes a sixth transistor having a gate electrode electrically connected to the first node, a source electrode to which the low DC voltage is configured to be applied, and a drain electrode electrically connected to the emission control signal output terminal.

13. The emission driver of claim 11, wherein the pull-down unit includes first and second pull-down transistors electrically connected in series,
- wherein the first pull-down transistor includes a gate electrode electrically connected to the first node, a source electrode electrically connected to a drain electrode of the second pull-down transistor, and a drain electrode electrically connected to an emission control signal output terminal, and
- wherein the second pull-down transistor includes a gate electrode to which a third clock signal is configured to be applied, a source electrode electrically connected to the gate electrode, and the drain electrode electrically connected to the source electrode of the first pull-down transistor.

14. The emission driver of claim 13, wherein the second input unit includes a third transistor having a gate electrode to which the second intermediate signal is configured to be applied, a source electrode to which the low DC voltage is configured to be applied, and a drain electrode electrically connected to the first node,
- wherein the first holding unit includes a fourth transistor having a gate electrode connected to the first node, a source electrode to which the high DC voltage is applied, and a drain electrode connected to the second node, and
- wherein the pull-up unit includes a fifth transistor having a gate electrode electrically connected to the second node, a source electrode to which the high DC voltage is configured to be applied, and a drain electrode electrically connected to the emission control signal output terminal.

15. The emission driver of claim 13, wherein the buffer block further includes a second holding unit configured to maintain the first node signal based at least in part on the second node signal, and wherein the second holding unit includes a holding transistor having a gate electrode electrically connected to the second node, a source electrode to which the high DC voltage is configured to be applied, and a drain electrode electrically connected to the first node.

16. A display device comprising:
- a display panel including a plurality of pixels;
- a data driver configured to output a plurality of data signals to the display panel;
- a scan driver including a plurality of scan stages each configured to output a scan signal to the display panel; and
- an emission driver including a plurality of stages each configured to output an emission control signal to the display panel,
- wherein the each of the stages of the emission driver includes:
  - a first driving block configured i) to receive a first input signal, first and second clock signals, and a first driving signal, and ii) output a first intermediate signal based at least in part on the first input signal and the first driving signal;
  - a second driving block configured to i) receive a second input signal, the first and second clock signals, and a second driving signal, and ii) output a second intermediate signal based at least in part on the second input signal and the second driving signal; and
  - a buffer block configured to i) receive the first and second intermediate signals, and ii) output the emission control signal based at least in part on the first and second intermediate signals,
- wherein the buffer block is further configured to selectively output the emission control signal so as to operate in a sequential emission mode or in a simultaneous emission mode, wherein the stages of the emission driver are configured to i) sequentially output a plurality of the emission control signals in the sequential emission mode and ii) substantially simultaneously output the emission control signals in the simultaneous emission mode,
- wherein the buffer block is further configured to determine a duration in which the emission control signal has a first voltage level based at least in part on an interval between a time point when the first intermediate signal has the low voltage level and a time point when the second intermediate signal has the low voltage level, and
- wherein the first driving block includes i) a first input unit configured to transmit the first clock signal to a second node based at least in part on a first node signal configured to be applied to a first node and ii) a stabilizing unit configured to stabilize the first intermediate signal based at least in part on a second node signal and the second clock signal, the second node signal being applied to the second node.

17. The display device of claim 16, wherein the buffer block is further configured to output i) the emission control signal having the first voltage level when the first intermediate signal has the low voltage level and ii) the emission control signal having a second voltage level lower than the first voltage level when the second intermediate signal has the low voltage level.

18. The display device of claim 17, wherein the first and second driving signals are configured to be maintained to have a high voltage level when the emission driver operates in the sequential emission mode, and wherein the first and second input signals and the first and second clock signals are configured to be maintained to have the high voltage level when the emission driver operates in the simultaneous emission mode.

19. The display device of claim 16, wherein the first driving block further includes:
- a second input unit configured to transmit the first input signal to the first node based at least in part on the first clock signal;
- a pull-up unit configured to pull up the first intermediate signal based at least in part on the second node signal configured to be applied to the second node;
- a pull-down unit configured to pull down the first intermediate signal based at least in part on the first node signal;
- a driving controller configured to inactivate the pull-down unit based at least in part on the first driving signal;
- a holding unit configured to maintain the second node signal based at least in part on the first clock signal.

20. The device of claim 16, wherein the buffer block includes:
- a first input unit configured to transmit i) a high DC voltage to a first node based at least in part on the first intermediate signal and ii) a low DC voltage to a second node based at least in part on the first intermediate signal;
- a second input unit configured to transmit the low DC voltage to the first node based at least in part on the second intermediate signal;
- a holding unit configured to maintain a second node signal configured to be applied to the second node based at least in part on a first node signal configured to be applied to the first node;
- a pull-up unit configured to pull up the emission control signal based at least in part on the second node signal; and
- a pull-down unit configured to pull down the emission control signal based at least in part on the first node signal.

* * * * *